United States Patent
Yang et al.

(10) Patent No.: US 7,961,797 B1
(45) Date of Patent: Jun. 14, 2011

(54) NONLINEAR VITERBI COMPLEXITY REDUCTION

(75) Inventors: Shaohua Yang, San Jose, CA (US); Zining Wu, Los Altos, CA (US)

(73) Assignee: Marvell International Ltd., Hamilton (BM)

(*) Notice: Subject to any disclaimer, the term of this patent is extended or adjusted under 35 U.S.C. 154(b) by 894 days.

(21) Appl. No.: 11/973,150

(22) Filed: Oct. 5, 2007

Related U.S. Application Data

(60) Provisional application No. 60/828,920, filed on Oct. 10, 2006.

(51) Int. Cl.
*H04K 1/10* (2006.01)

(52) U.S. Cl. ........ 375/260; 375/341; 375/348; 375/340; 375/263; 714/794; 714/795; 714/792; 714/796

(58) Field of Classification Search ............ 375/341, 375/265, 262, 340, 260, 348; 714/794, 795, 714/796, 792
See application file for complete search history.

(56) References Cited

U.S. PATENT DOCUMENTS

| | | | |
|---|---|---|---|
| 7,607,072 B2 * | 10/2009 | Ashley et al. | 714/792 |
| 7,620,882 B2 * | 11/2009 | Kanaoka et al. | 714/794 |
| 2002/0073378 A1 * | 6/2002 | Shieh | 714/795 |
| 2002/0174402 A1 * | 11/2002 | Yamamoto | 714/795 |
| 2005/0138535 A1 * | 6/2005 | Parthasarathy et al. | 714/796 |
| 2005/0157823 A1 * | 7/2005 | Sudhakar | 375/341 |
| 2007/0076826 A1 * | 4/2007 | Stockmanns et al. | 375/341 |
| 2008/0189532 A1 * | 8/2008 | Haratsch | 712/239 |
| 2008/0317179 A1 * | 12/2008 | Azadet et al. | 375/348 |

* cited by examiner

*Primary Examiner* — Eva Y Puente

(57) ABSTRACT

System and methods for reducing the complexity or area of a non-linear Viterbi detector. In some embodiments, a Viterbi detector calculates branch metrics for a subset of the branches in a trellis diagram. This subset may be selected based on comparing an equalized signal with a signal level table of all the possible branches. These branch metrics may be calculated using high performance branch metric calculation techniques. The remaining branch metrics may be calculated based on the computed branch metrics using a technique that consumes fewer resources. The Viterbi detectors in the present invention may also be used in an iterative decoding scheme, where multiple detectors are cascaded. In these embodiments, a Viterbi detector may select a subset of the branches based on detection results from other Viterbi detectors.

65 Claims, 20 Drawing Sheets

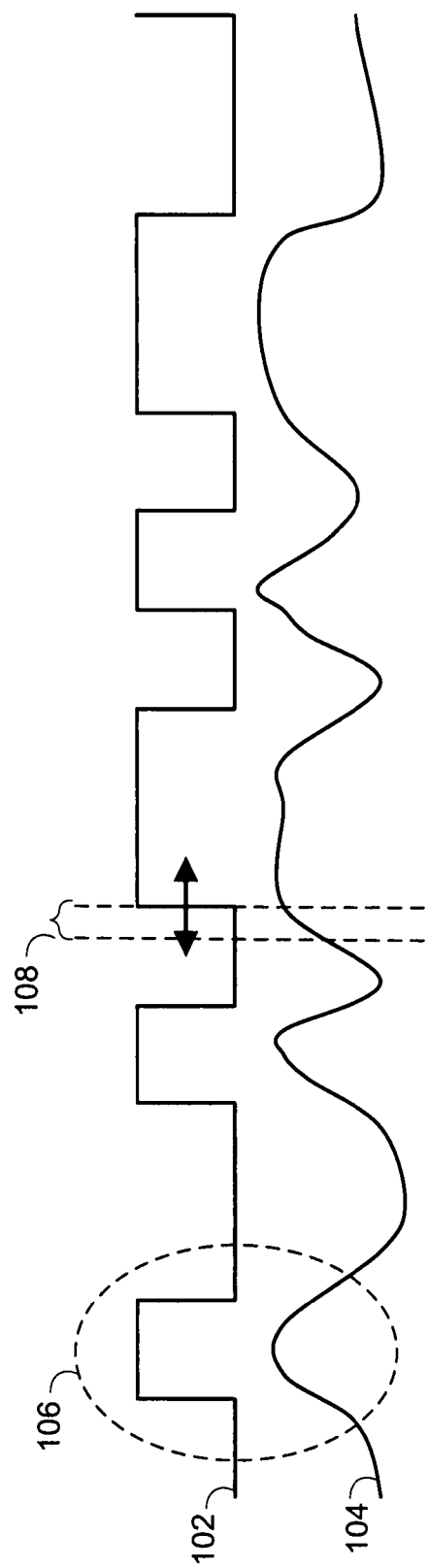

NONLINEAR VITERBI COMPLEXITY REDUCTION

CROSS-REFERENCE TO RELATED APPLICATION

This application claims the benefit under 35 U.S.C. §119(e) of U.S. Provisional Application No. 60/828,920, filed Oct. 10, 2006, which is incorporated herein by reference in its entirety.

BACKGROUND

This application relates generally to systems, methods, and apparatuses for digital signal detection, and more particularly to a non-linear Viterbi detector with reduced complexity.

With the continuing demand for high-speed digital communications systems and high-density digital storage systems, various techniques have been applied to increase the capacity of these systems. For example, in magnetic media storage, many manufacturers are using perpendicular recording rather than traditional longitudinal recording to pack more information into a smaller area. However, as data speeds and storage densities are pushed to their limits and beyond, the amount of signal distortion on information-carrying signals have increased dramatically. Thus, detectors are heavily relied upon to interpret the information in these highly distorted signals.

In fact, digital transmission and storage systems have reached a point where signal-dependent noise, such as transition jitter, often overwhelm white noise. Therefore, non-linear Viterbi detectors, designed to whiten signal-dependent noise, are currently being used in place of their less-effective linear counterpart. However, current non-linear Viterbi detectors are highly complex and typically consume a large amount of resources. In particular, because such detectors typically run at high speeds, they often have large area and high power consumption. Thus, non-linear Viterbi detectors might not be appropriate in various detection situations, such as in iterative decoding systems, where multiple detectors are cascaded. Therefore, it would be desirable to provide techniques for reducing the complexity of non-linear Viterbi detectors for high-speed communications systems and high-density storage systems.

SUMMARY

Systems and methods are provided for computing branch metrics for use in identifying information in a signal The branch metrics may be computed by, for example, a non-linear Viterbi detector.

In some embodiments of the present invention, a reduced-complexity non-linear Viterbi detector is provided. The Viterbi detector may implement the Viterbi algorithm. First, the Viterbi detector may compute branch metrics associated with each of the branches between two time intervals in a trellis diagram. A branch metric indicates the likelihood that a particular branch in the trellis diagram is the correct branch, where a lower branch metric indicates a more likely branch. The Viterbi detector may use these branch metrics, and the branch metrics for other time periods, to determine the most likely path through the trellis diagram. The detector may then output soft or hard information based on the determined most likely path.

The Viterbi detector may include a branch metric computation unit to calculate branch metrics for each signal transition. For example, if the Viterbi detector operates based on a 16-state trellis diagram, the branch metric computation unit may compute up to 32 branch metrics for each signal transition. The branch metric computation unit may compute branch metrics using at least two different techniques. In particular, the branch metric computation unit may separate branch metrics into at least two categories: probable branches that are more likely to be the correct branch and improbable branches that are less likely to be the correct branch. The branch metric computation unit may compute branch metrics for the probable branches using a high-resolution, more resource-intensive technique, and may compute branch metrics for the improbable branches using a lower-resolution, less resource-intensive technique. The resources used by the branch metric computation unit includes, for example, silicon area, processing speed, and power consumption. Thus, by limiting the number of more resource-intensive computations to only the most likely branches, the overall power consumption and hardware complexity may be reduced.

In some embodiments, the branch metric computation unit may determine whether a branch is probable or improbable based on comparing an input signal with a signal level table. The input signal may be a zero-mean, or "filtered mean," equalized signal originally received from a channel. The signal level table may be a table of voltage levels, where each voltage corresponds to a branch in the trellis diagram. The voltage for a particular branch in the signal level table may be the expected voltage of the input signal if the input signal were to take that particular branch. Therefore, the branch metric computation unit may determine the probable branches by selecting branches having voltages in the signal level table closest to the value of the input signal.

In some embodiments of the present invention, the branch metric computation unit may calculate branch metrics for probable branches based on the input signal, or an equalized (e.g., FIR filtered) version of the input signal. For the remaining, improbable branches, rather than using the equalized signals, the branch metrics may be computed based on the branch metrics of the probable branches. For example, a predetermined offset may be added to the branch metric of a probable branch to obtain the branch metric of an improbable branch. Therefore, any extra signal processing associated with computing branch metrics for the improbable branches can be avoided. This can result in considerable resource savings compared to the resources used to calculate branch metrics for probable branches.

In some embodiments of the present invention, a reduced-complexity non-linear Viterbi detector is provided for use in a cascade of two or more detectors/decoders to implement an iterative decoding scheme. In some embodiments, some of the detectors in the cascade may have more information available (e.g., from previous detectors/decoders) to make detection decisions than a single, standalone detector. In particular, the final detector in the cascade may make detection decisions based on an equalized signal as well the detection decision for this equalized signal generated by the previous detector.

A branch metric computation unit for a Viterbi detector in a cascade of detectors may determine the likelihood of a particular branch based on a decision output of a previous detector. Therefore, previous decisions obtained from another Viterbi detector may be used to focus the current detector around trellis paths and branches that are expected to be correct. In particular, the branch metric computation unit of the Viterbi detector may use information from the previous detector to determine probable and improbable branches, and may select which type of branch metric computation to apply to a branch based on this determination.

BRIEF DESCRIPTION OF THE DRAWINGS

The above and other aspects and advantages of the invention will be apparent upon consideration of the following detailed description, taken in conjunction with the accompanying drawings, in which like reference characters refer to like parts throughout, and in which:

FIG. 1 shows illustrative signals that correspond to a bit stream;

DETAILED DESCRIPTION

In a digital communications or storage system, digital information (e.g., a binary message) is carried via a signal. To recover the information, one or more detectors may be used to interpret, or "detect," the signal. Detection is a difficult and often error-prone task, because the signal can be distorted by a media.

The media is referred to herein as a channel. For digital communications systems, the channel may be a wired or wireless media through which the signal travels. For digital storage systems, the channel may be the media in which the digital information is stored. In some embodiments, a digital storage system is a magnetic storage device, such as a hard disk. In these embodiments, the channel is referred to as a magnetic recording channel.

The particular type and degree of signal distortion can depend on the characteristics of a channel. FIG. 1 illustrates signal distortion that may be caused by a magnetic recording channel. Signal 102 represents an ideal, intended signal provided by a magnetic recording device, and signal 104 represents the actual signal that is provided from the magnetic recording device to a detector. The differences between signal 102 and signal 104 can be caused by the magnetic recording channel. In particular, the magnetic recording channel can cause inter-symbol interference. That is, the channel can spread the signal such that neighboring areas of the signal, which are meant to be separate, affect each other. Inter-symbol interference is illustrated, for example, by region 106 of FIG. 1, where a clean pulse in signal 102 is spread to a smooth curve in signal 104. Also, the magnetic recording channel can cause transition jitter, where the "edges" of the actual signal do not coincide with the edges of the ideal signal. Transition jitter is illustrated, for example, by time difference 108, which shows the approximate time difference between a low-to-high transition in signal 102 and the corresponding low-to-high transition in signal 104.

It should be understood that the present invention can be used for any channel, and is not limited to magnetic recording channels. Other distortion effects that a communications or storage channel can cause include, but are not limited to, inter-track interference or cross-talk, erasures, fades, reflections, and other filtering effects. The embodiments of the present invention described below may be effective in detecting information from a signal distorted from any of the above, or any other, effects.

Figure 2A:
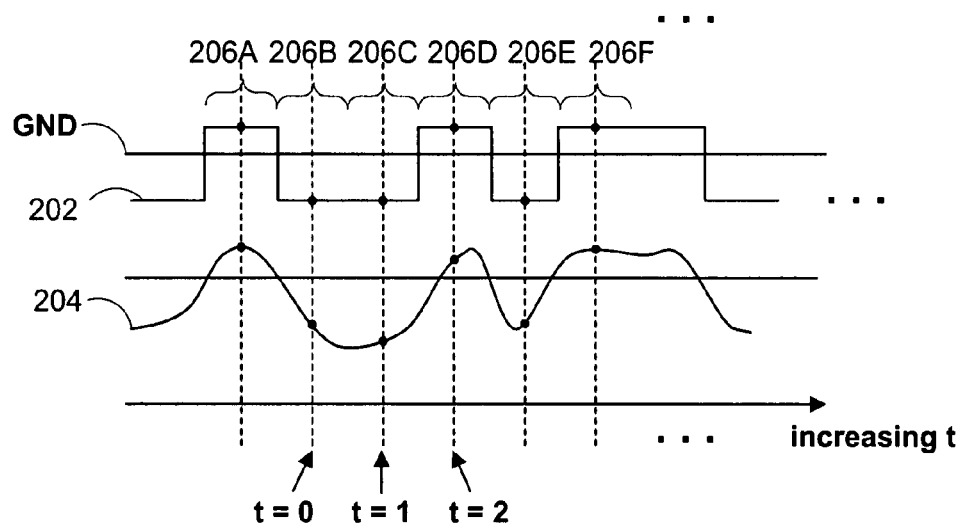
FIG. 2A illustrates a digital information sequence associated with the signals of FIG. 1.

FIG. 2A illustrates one possible representation of the digital information contained in the signals of FIG. 1. In some embodiments, signal 202 can take on values of +a (HIGH) or −a (LOW). This type of signaling is referred to as non-return-to-zero (NRZ) signaling, because signal 202 does not have a rest, or zero, state. The value of signal 202 during each time interval, or "symbol period" 206A-206F, can convey a portion of the digital information sequence. In particular, the value of the signal during a symbol period may present information about a "symbol," or group of bits, in the digital information sequence. In FIG. 2A, each symbol period presents information about a one-bit symbol. A HIGH signal level represents a '1' in the digital information sequence, and a LOW signal level represents a '0' in the digital information sequence. Thus, signal 202 is an NRZ signal representation of a bit sequence given by "100101 . . . ."

It should be understood that a transmitted or played back digital information sequence may be conveyed in any suitable way. For example, in some embodiments, each symbol period may correspond to a symbol of more than one bit. In these embodiments, the signal may have more than two levels (e.g., 4, 16, etc.). In still other embodiments, the signal may be a return-to-zero signal.

Figure 2B:
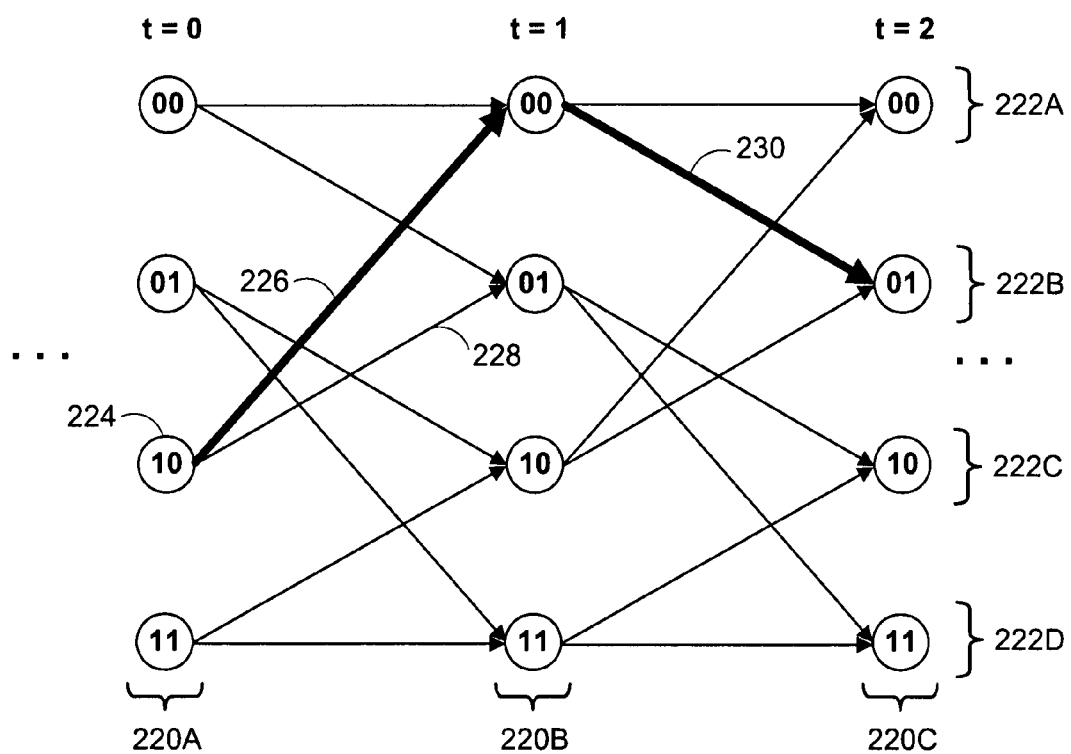
FIG. 2B shows a trellis diagram illustrating the digital information sequence of FIG. 2A.

A digital information sequence, such as the sequence shown in FIG. 2A, may be represented by a particular path in a trellis diagram. A trellis diagram is a state-based, graphical representation of all the possible permutations that a digital information sequence may take. The vertical axis typically shows states corresponding to different bit sequences, and the horizontal axis typically shows states at different time periods. FIG. 2B shows one embodiment of a four-state trellis diagram. On the vertical axis, states 222A correspond to a recent bit sequence of "00," states 222B correspond to a recent bit sequence of "01" (where '1' is the most recent bit), states 222C correspond to a recent bit sequence of "10," and states 222D correspond to a recent bit sequence of "11." On the horizontal axis, states 220A, 220B, and 220C represent states of consecutive symbol periods. Each state has two branches leading to states at a next time interval. For example, branches 226 and 228 set out from state 224, a "10" state. From state 224, if the next bit in the signal is detected as '0,' the three most recent bits would be "100." Because a four-state trellis diagram only keeps track of the most recent two bits, "100" belongs in a "00" state (states 222A), so branch 226 would be taken. If instead, a '1' is detected next, the sequence at the next symbol period would become "101," and branch 228 leading to a "01" state (states 222B) would be taken. Therefore, referring to both FIGS. 2A and 2B, signal 202 of FIG. 2A would correspond to a trellis path in FIG. 2B that includes branch 226 and branch 230. This path is highlighted in FIG. 2B for emphasis.

In general, a trellis diagram can keep track of the most recent M bits. The trellis diagram would then have up to $2^M$ states at each time interval. In some embodiments, a trellis diagram may have fewer than $2^M$ states at some time intervals. For example, a trellis diagram may have fewer states if the corresponding digital information sequence is a message encoded using an error correction code (ECC) (e.g., a ½-rate convolutional code). That is, coding would restrict the number of possible information sequences, which in turn would reduce the number of states in the trellis representation. Also, each branch may correspond to more than one bit.

A detector, such as a non-linear Viterbi detector, may attempt to determine the information in a signal by finding a corresponding path in a trellis diagram. In some embodiments, the detector may find a path using the Viterbi algorithm. Using the Viterbi algorithm, a detector can find the path that corresponds to the highest probability of being the correct path. This type of detector is referred to as a maximum-likelihood detector. Thus, even if a signal is distorted to a signal similar or worse than signal 204 of FIG. 2A, the detector may still be able to recover the information in the signal.

The Viterbi algorithm, which is known in the art, will be briefly described below with reference to FIG. 3. It should be understood, however, that the description is simplified and illustrative, and is not meant to limit the present invention in any way.

Figure 3:
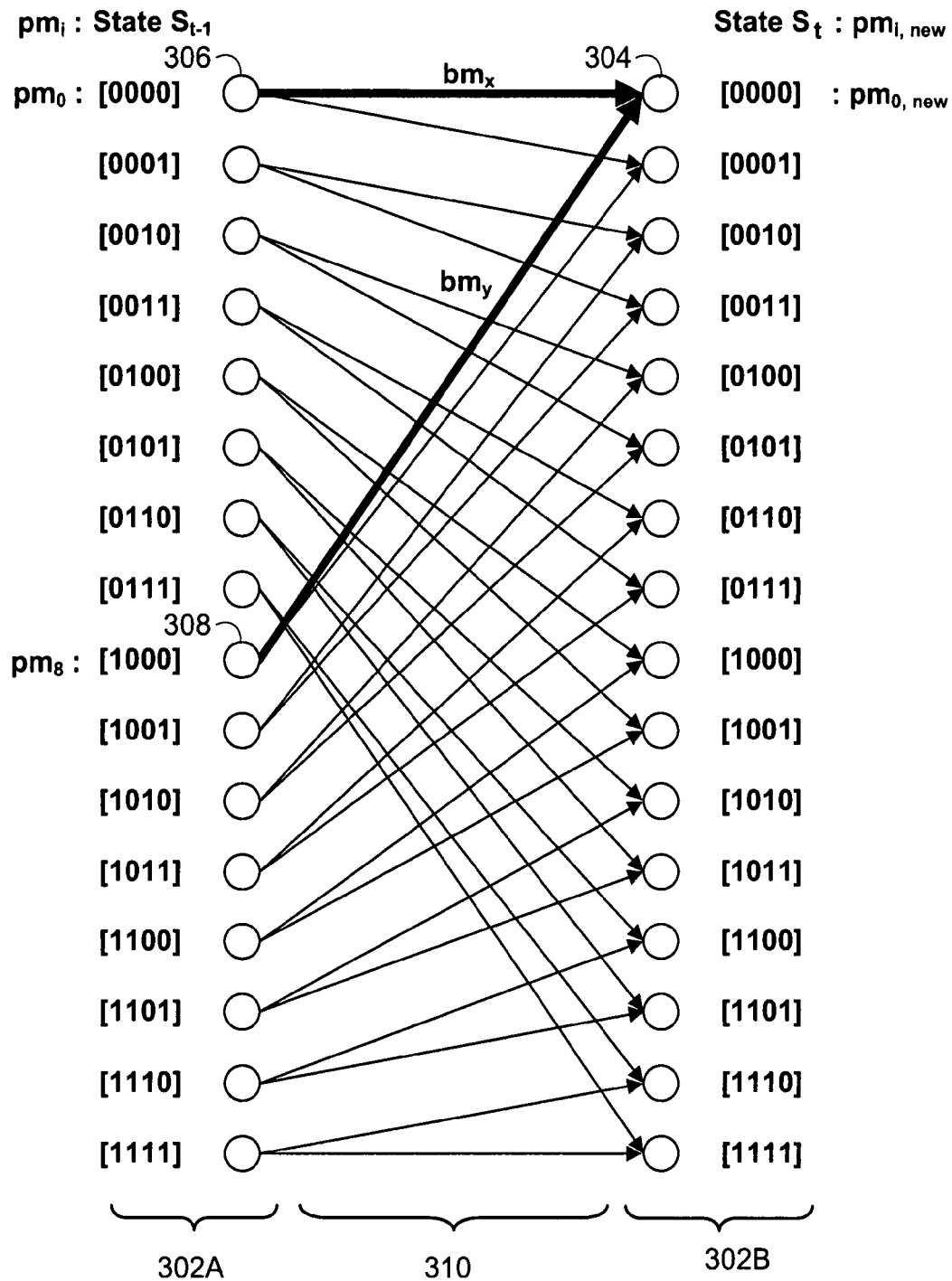
FIG. 3 illustrates a state transition in a 16-state trellis.

Referring now to FIG. 3, two time intervals of a 16-state trellis diagram are illustrated. Each state, $S_{t-1}$, among states 302A may have many previous partial paths leading to that state (not shown). Of all the partial paths leading to that state, one partial path is a partial path that has the highest probability of corresponding to the actual information sequence. This partial path may be called the most likely path. Each state in $S_{t-1}$ (states 302A) has an associated most likely path. Of all of the states in states 302A, the state with the most likely path having the highest probability is referred to as the "best state" for that time interval. Typically, rather than associating each partial path with a probability, each partial path may be associated with a path error value. Using this standard, the partial path with the lowest path error value becomes the most likely path for a state. This path error value will be referred to herein as the "path metric," or simply "pm." In the 16-state trellis diagram of FIG. 3, the ith state of states 302A, where $0 \leq i \leq 15$, is associated with a path metric given by $pm_i$.

When a new symbol period is processed by a detector, the detector can determine the path metrics associated with the 16 new states in the next symbol period, $S_t$ (states 302B). The path metrics for the states in this next time interval are based on the path metrics at the previous time interval, $pm_i$, and on the probabilities, or branch error values, associated with branches 310 between the two time intervals. The branch error value associated with each of the 32 branches (two each from the 16 $S_{t-1}$ states) in branches 310 is referred to as a "branch metric." A detector can find the most likely partial path leading to each of states 302B. For example, the most likely partial path leading to state 304 is either the most likely partial path to state 306 followed by a "0000"->"0000" branch, or the most likely partial path to state 308 followed by a "1000"->"0000" branch. To quantitatively find the most likely partial path, a detector can determine the associated path metrics for these two options. In particular, a detector may calculate $(pm_o+bm_x)$ and $(pm_8+bm_y)$. The path metric, $pm_{o,new}$, for state 304 can be set to the lower of the two sums and the most likely partial path to state 304. Accordingly, after computing the most likely partial path for each of states 302B, the best state is the minimum of $pm_{i,new}$. The detector may continue to move to new states at new time intervals in a similar manner, and may continue to calculate the best state at each time interval. To output information, the detector may recall and output the digital sequence associated with the most likely path of the current best state.

Figure 4:
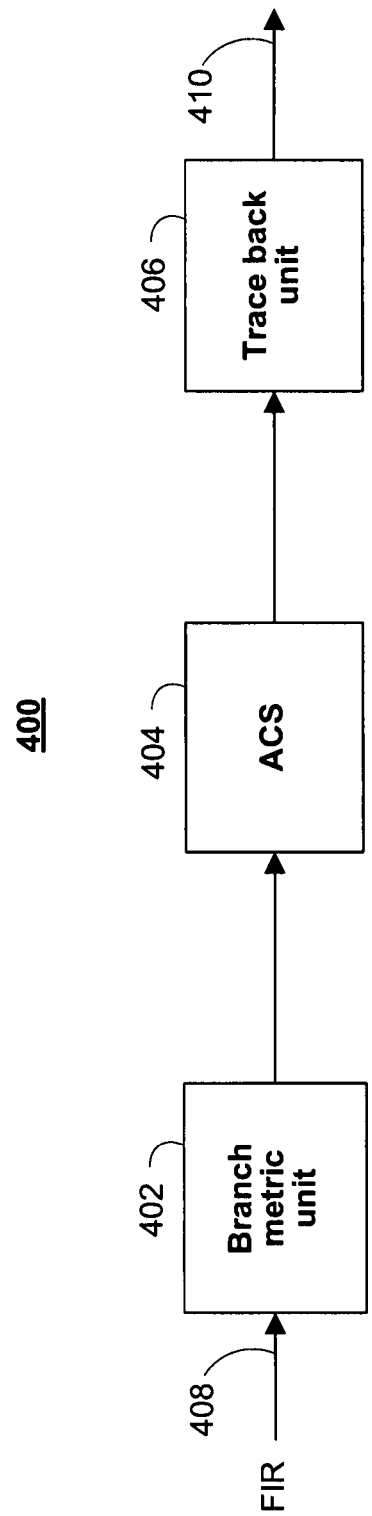
FIG. 4 shows a simplified block diagram of a Viterbi detector.

Referring now to FIG. 4, a simplified block diagram of illustrative detector 400 is shown. Detector 400 may include branch metric computation unit 402, ACS 404, and trace back unit 406. Detector 400, its components, and any components or subcomponents not shown in FIG. 4, may be implemented using any suitable combination of hardware (e.g., one or more integrated circuits, ASICs, and FPGAs), software, or firmware. Detector 400 can implement the Viterbi algorithm, as described above in connection with FIG. 3. In particular, branch metric computation unit 402 may determine branch metrics associated with each possible branch. For example, for a 16-state trellis, branch metric computation unit 402 may compute up to 32 branch metrics. Thus, branch metric computation unit 402 may be operable to determine the values of $bm_x$ and $bm_y$ in the example of FIG. 3. In some embodiments, branch metric computation unit 402 may determine branch metrics based on a signal obtained from a channel. In other embodiments, branch metric computation unit 402 may determine branch metrics based on a signal that has been equalized by a finite input response (FIR) filter or equalizer (not shown). Thus, the input into branch metric computation unit 402 may be referred to as FIR signal 408. A detailed branch metric computation unit will be described below with reference to FIG. 5.

The branch metrics provided by branch metric computation unit 402 may be used by ACS 404 to determine the path metric for each state in the current symbol period. ACS 404, which stands for "add-compare-select," can perform the three operations of adding, comparing, and selecting. In particular, ACS 404 may add previous path metrics with the branch metrics provided by branch metric computation unit 402 to determine new potential path metrics. ACS 404 then may compare the potential path metrics for each current state and may select the smallest potential path metric as the most likely path for the current state. For the example of FIG. 3, ACS 404 may compute $(pm_o+bm_x)$ and $(pm_8+bm_y)$ and may select the lower of the two sums. In some embodiments, Viterbi detector 400 implements a soft-output Viterbi algorithm (SOVA), which outputs soft information rather than hard information. In these embodiments, ACS 404 may also compute a reliability indicator associated with choosing the lower error path. The reliability indicator may be in the form of a log-likelihood ratio for each information bit in the digital information sequence. Various implementations of ACS units for soft and hard output Viterbi detectors are known in the art. The present invention is not limited to any particular implementation.

At a suitable time, trace back unit 406 can recall the partial path that corresponds to the most likely path. For soft-output Viterbi algorithm (SOVA) detectors, trace back unit 406 may also recall the reliability indicators associated with each state. Thus, trace back unit 406 may output either hard or soft information at output 410. That is, trace back unit 406 may output a hard '1' or hard '0,' or trace back unit 406 may output information indicative of the likelihood of a hard '1' or hard '0.' Trace back unit 406 may include a storage system, such as RAM, to store pointers back through the trellis diagram that represent potential best paths. In some embodiments, the storage system may also store reliability indicators. Various implementations of trace back units for Viterbi detectors are known in the art. The present invention is not limited to any particular implementation.

It should be understood that the description above of detector 400 is merely illustrative, and is intended to show that detector 400 is capable of implementing the Viterbi algorithm, as simply described above in connection to FIG. 3. Thus, detector 400 can include any other components that may, for example, enhance the performance or functionality of detection.

In known implementations of Viterbi detectors, every branch metric between a set of current states and a set of next states is computed by a branch metric computation unit. For the example of FIG. 3, 32 branch metrics would be computed. Each of these computations may be time and/or computationally intensive. For non-linear Viterbi detectors, the branch metric computations may be especially expensive. For example, in some embodiments, a Viterbi detector may compute branch metrics according to $$BM = \frac{\left(\sum_{i=0}^{L} f_i Y_{t-i} - \sum_{i=0}^{L} f_i S_t\right)^2}{2\sigma^2} + \frac{1}{2}\log(2\pi\sigma^2),$$

where $S_t$ is a next state, Y is the input signal, $f_i$ are coefficients of a signal-dependent noise-whitening filter, and $\sigma^2$ is the variance of the whitened noise. The noise-whitening filters themselves may take up significant silicon area. Because a detector may need to compute branch metrics quickly to continually detect an incoming signal, separate constructs may be needed to compute branch metrics in parallel. Thus, each construct would implement the high-power and complex branch metric equation above. However, many of the branches have extremely low probability of being the correct branch. In fact, most branches may have such low probability that an accurate branch metric calculation may not be necessary, because, in most circumstances, the branch metric associated with such low probability branches could simply be discarded by the add-compare-select unit. Accordingly, the present invention discloses a technique for determining probable branches in a trellis diagram. The Viterbi detector may then calculate branch metrics using different approaches depending on whether a branch is a probable or improbable branch. Thus, the various embodiments of Viterbi detectors disclosed herein may result in considerable hardware, complexity, speed, and power savings without significantly affecting the performance of detection.

Figure 5:
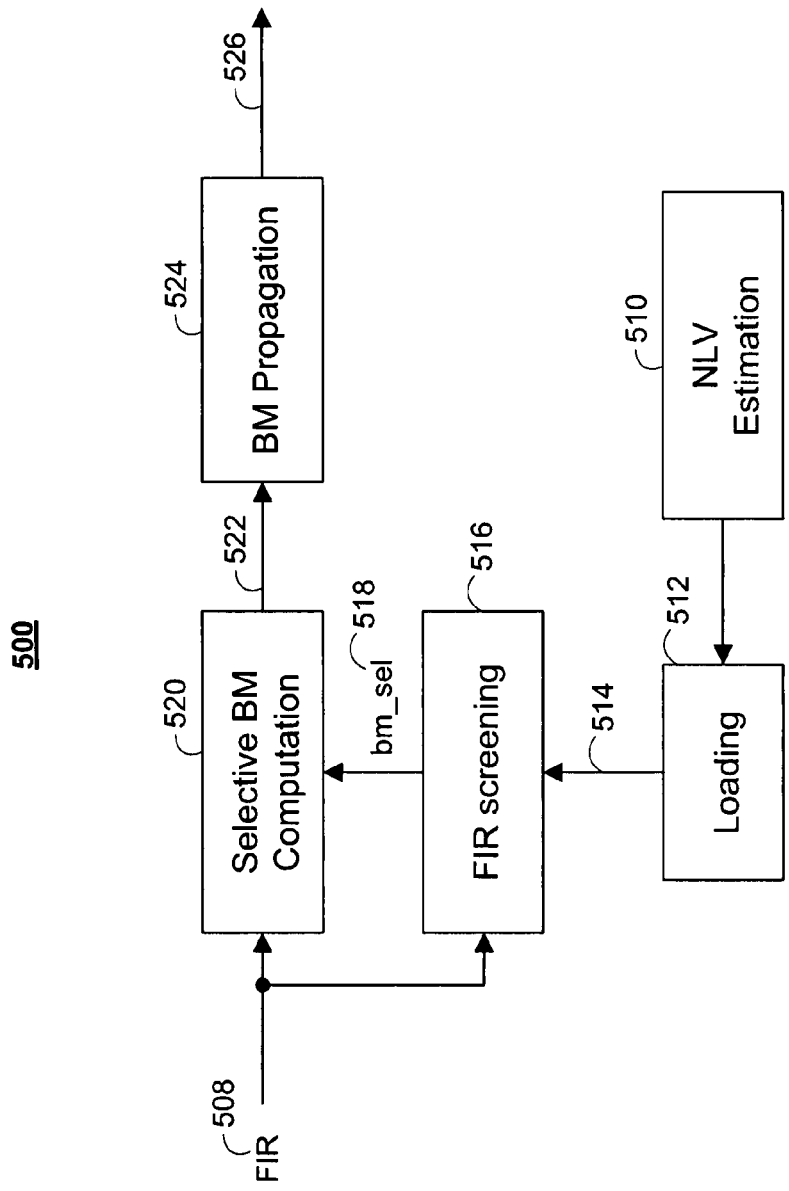
FIG. 5 shows an embodiment of a branch metric computation unit.

Referring now to FIG. 5, illustrative branch metric (BM) computation unit 500 is provided that may calculate branch metrics differently depending on whether a branch is probable or improbable. In particular, branch metric computation unit 500 can include a first computation unit, identified as selective BM computation unit 520, that computes branch metrics for probable branches, and a second computation unit, identified as BM propagation unit 524, that computes branch metrics for improbable branches and uses fewer resources than the first computation unit. Any of the components, features, or functionalities of BM computation unit 500 may be implemented in BM computation unit 402 of FIG. 4.

Branch metric computation unit 500 also includes NLV estimation unit 510, loading unit 512, and FIR screening unit 516. The operation of BM computation unit 500 will be demonstrated below in connection with FIGS. 6-9. In particular, the operation of loading unit 512 and NLV estimation unit 510 will be discussed below in connection with FIG. 6, the operation of FIR screening unit 516 will be discussed below in connection with FIG. 7, the operation of selective BM computation unit 520 will be discussed below in connection with FIG. 8, and BM propagation unit 524 will be discussed below in connection with FIG. 9.

Loading unit 512 of BM computation unit 500 may associate each branch of a trellis diagram with a signal level (e.g. a voltage level). Each signal level may be an estimate of the voltage of a signal that takes the associated branch. Because of the characteristics of a channel, the voltage of a signal may depend not only on the information in the current symbol period, but also on previous symbol periods. Thus, each branch (e.g., "0000"->"0001") of a trellis diagram, which may represent both the current and previous symbol periods, may take a range of values. Loading unit 512 may provide estimates for each of these values, which are referred to collectively as a signal level table. To obtain estimates for each branch, loading unit 512 may utilize information from NLV estimation unit 510. NLV estimation unit 510 may estimate and provide information that includes, for example, noise whitening filter coefficients for each trellis branch and the corresponding whitened noise variance, or other suitable NLV-dependent information.

In some embodiments, loading unit 512 may also simplify branch metric calculation (described below) by normalizing or simplifying branch metric parameters. This may reduce the overall logic and complexity required by BM computation unit 500.

Figure 6:
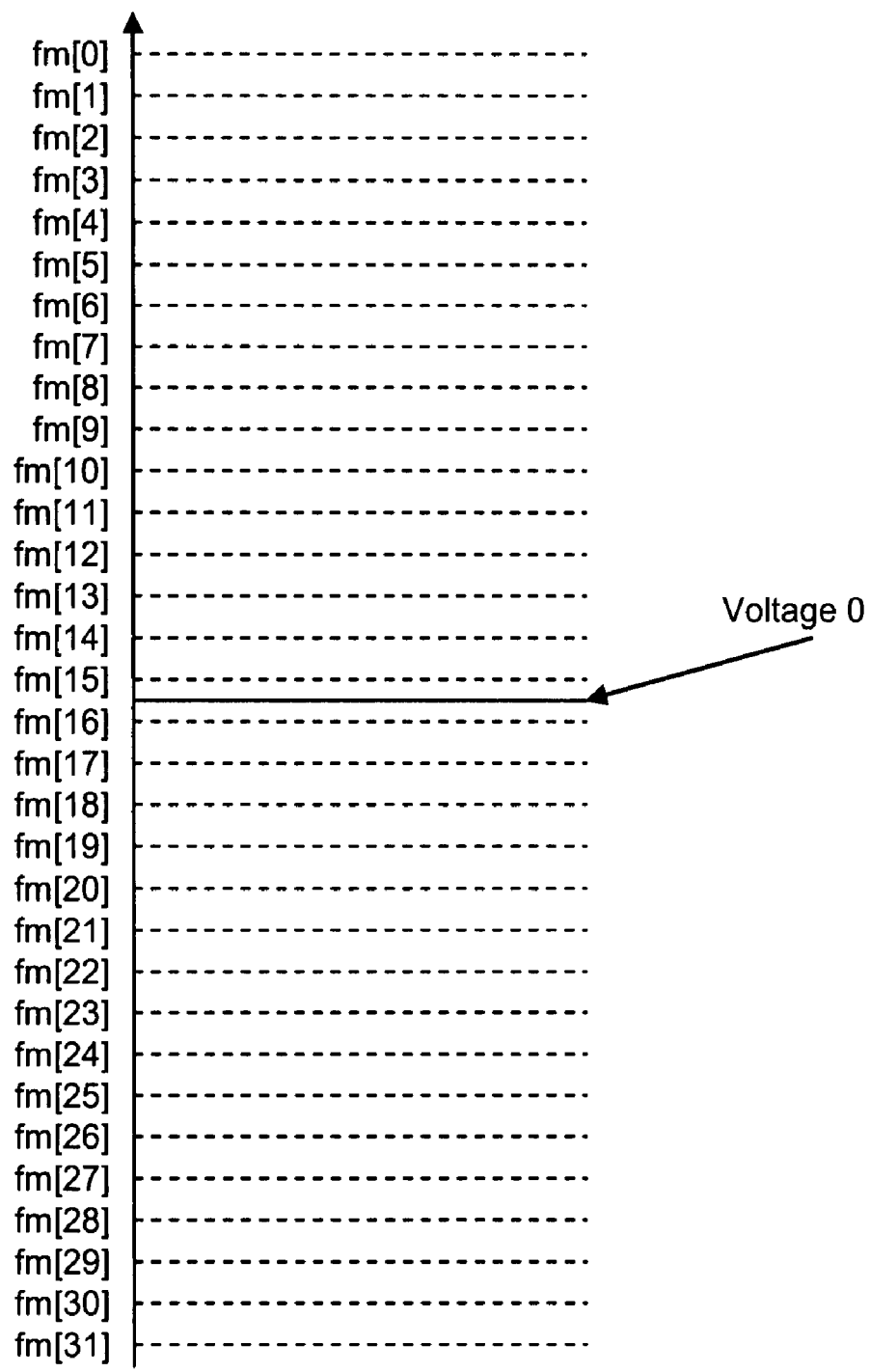
FIG. 6 shows trellis branch signal levels generated by the loading unit in FIGS. 5 and 11.

FIG. 6 shows a graphical representation of a signal level table that may be provided by some embodiments of a loading unit (e.g., loading unit 512 of FIG. 5). Each dotted line is a voltage level that corresponds to a particular branch in a trellis diagram. As described above, these voltage levels may be voltage estimates of an input signal. In some embodiments, the input signal may be a signal obtained from a channel that is equalized by an FIR filter and filtered to be centered around zero volts (referred to as "mean filtering"). Thus, the voltage estimates provided by the loading unit may be estimates of an equalized and mean-filtered input signal. In FIG. 6, each voltage level is labeled as "fm," or "filtered mean." In the figure, there are 32 different voltage levels illustrated. Accordingly, the signal level table may correspond to any suitable trellis diagram that has 32 branches between two consecutive states. In some embodiments, FIG. 6 illustrates a trellis branch index table for a 16-state trellis diagram, such as the partial trellis diagram illustrated in FIG. 3. In other embodiments, FIG. 6 may show a signal level table for a trellis diagram with greater than 16 states and a reduced number of branches (e.g., a trellis diagram of a convolutional code). The number of states, and therefore the number of branches between the states, may vary depending on the particular specifications of each Viterbi decoder. The variable, S, will hereinafter refer to the number of branches between two consecutive states.

The branch signal level table of FIG. 6 is ordered and numbered according to the value of the voltage levels. The order of the voltage levels does not necessary correspond to an ordering of the branches in the trellis diagram. In fact, any one-to-one mapping from a branch in the trellis diagram to a voltage level in the signal level table may be used, and may depend on the particular type of input signal. A loading unit (e.g., loading unit 512 of FIG. 5) may keep track of the ordering of the branches in the signal level table.

In FIG. 6, the zero-voltage point, or ground, is shown to be between the 15th and 16th voltage levels of the trellis branch index table. Thus, half of the branch voltage levels are positive voltages, and half of the branch voltage levels are negative voltages. This distribution may be beneficial for many reasons, including to aid in the calculation of the branch metrics. However, this is merely illustrative. The voltage levels may all be positive, may all be negative, or may have a distribution other than half positive and half negative. Thus, in some embodiments, the voltages in the signal level table may not be centered around zero volts. Also, in some embodiments of the present invention, and as shown in FIG. 6, the voltage difference between each consecutive voltage level may be substantially equal. This may be the case because of the characteristics of a channel, or because of a simplification. Therefore, FIG. 6 shows that the magnitude of fm[0] is substantially equal to fm[31], the magnitude of fm[1] is substantially equal to fm[30], etc. This type of spacing may be beneficial, because each voltage level is as far apart as possible from any other voltage level. However, the distribution of voltage levels in FIG. 6 is also illustrative. In other embodiments of the present invention, the voltage difference between two consecutive voltage levels may be different than the voltage difference between two other consecutive voltage levels. For illustrative purposes, the signal level table of FIG. 6 will be used in each of the examples provided below. It should be understood that any of these examples may be altered according to the teachings of the present invention for any other suitable signal level table.

Referring back to BM computation unit 500 of FIG. 5, a voltage-based signal table may be provided to FIR screening unit 516 at node 514 by loading unit 512. This signal table may be the same or similar to the table of FIG. 6. From the signal level table, FIR screening unit 516 may then choose a set of most likely, or probable, branches. The number of probable branches may be predetermined (e.g., hard-wired or hard-coded). Alternatively, the number of predetermined branches may be programmed by a user. In still other embodiments, the number of predetermined branches is determined based on another criteria, such as voltage level range. FIR screening unit 516 may determine the set of probable branches based on a signal obtained from the channel. In some embodiments, FIR screening unit 516 may determine the set of probable branches based on an equalized, filtered mean version of the signal.

Figure 7:
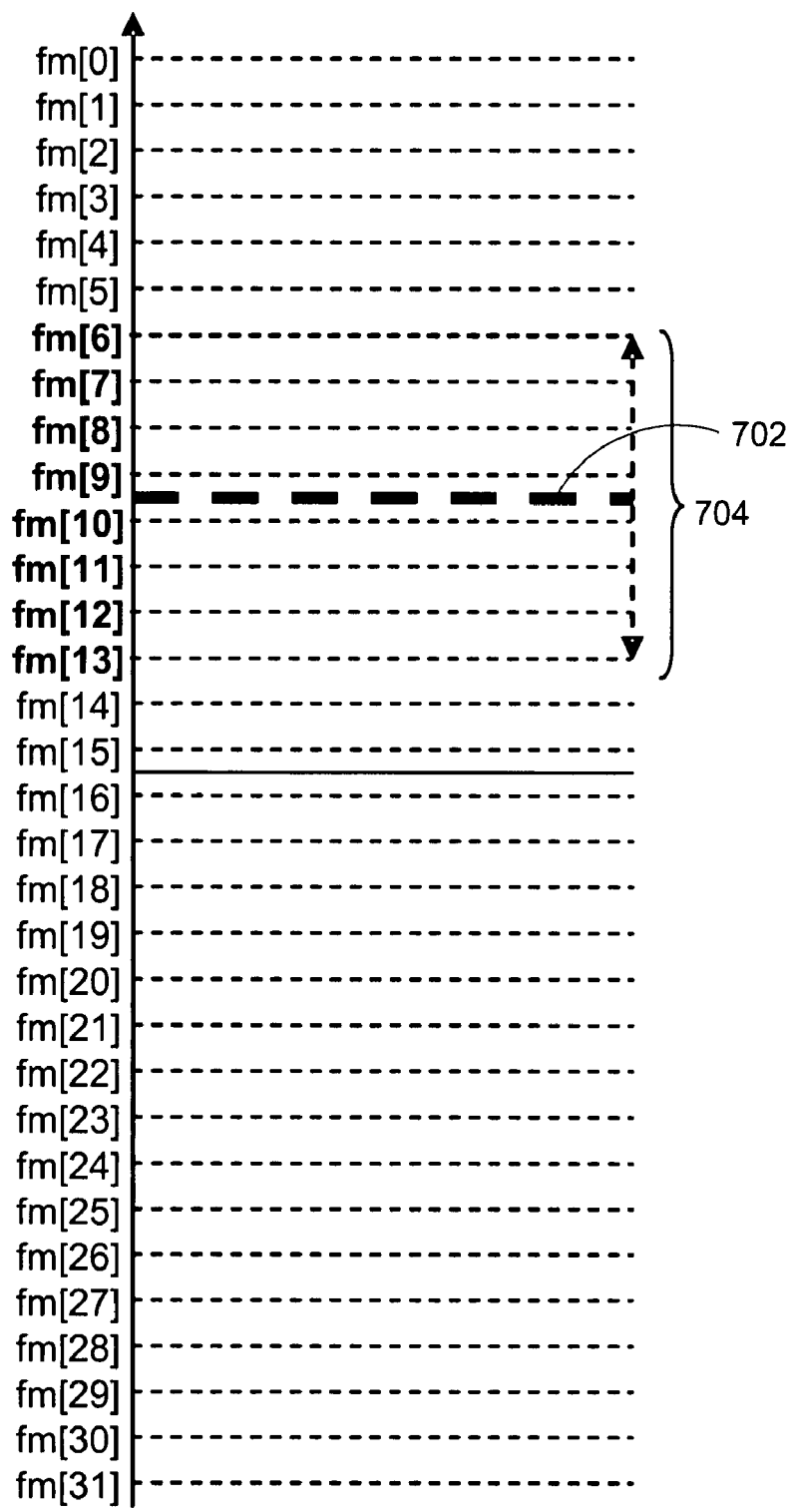
FIG. 7 illustrates probable branch selection for the branch metric computation unit of FIG. 5 based on the trellis branch levels of FIG. 6.

FIG. 7 illustrates the operation of one embodiment of an FIR screening unit (e.g., FIR screening unit 516 of FIG. 5) using a signal level table similar to the table shown in FIG. 6. An input signal, which in this case may be an equalized and mean-filtered input signal, may translate to any voltage within the signal level table. Because of noise and other unanticipated channel effects, a detected signal may not fall exactly on one of the dotted lines. In this particular scenario, the filtered mean FIR signal is detected with voltage 702 in between voltage levels fm[9] and fm[10]. Based on the detected voltage level, the FIR screening unit may choose R probable branches. The variable, R, will hereinafter refer to the number of probable branches chosen by an FIR screening unit. The value of R can take on any suitable value, and may be chosen based on any suitable technique. In FIG. 7, the eight voltage levels closest to the detected signal are chosen as the probable branches, so R=8. These voltage levels are fm[6] through fm[13], and are designated as voltage levels 704.

Returning to FIG. 5, FIR screening unit 516 outputs bm_sel signal 518 to indicate which branches of a trellis diagram are probable. Using bm_sel signal 518, selective BM computation unit 520 computes branch metrics for the R probable branches. Thus, selective BM computation unit 520 may include up to R computation units to compute the R branch metrics in parallel.

Figure 8:
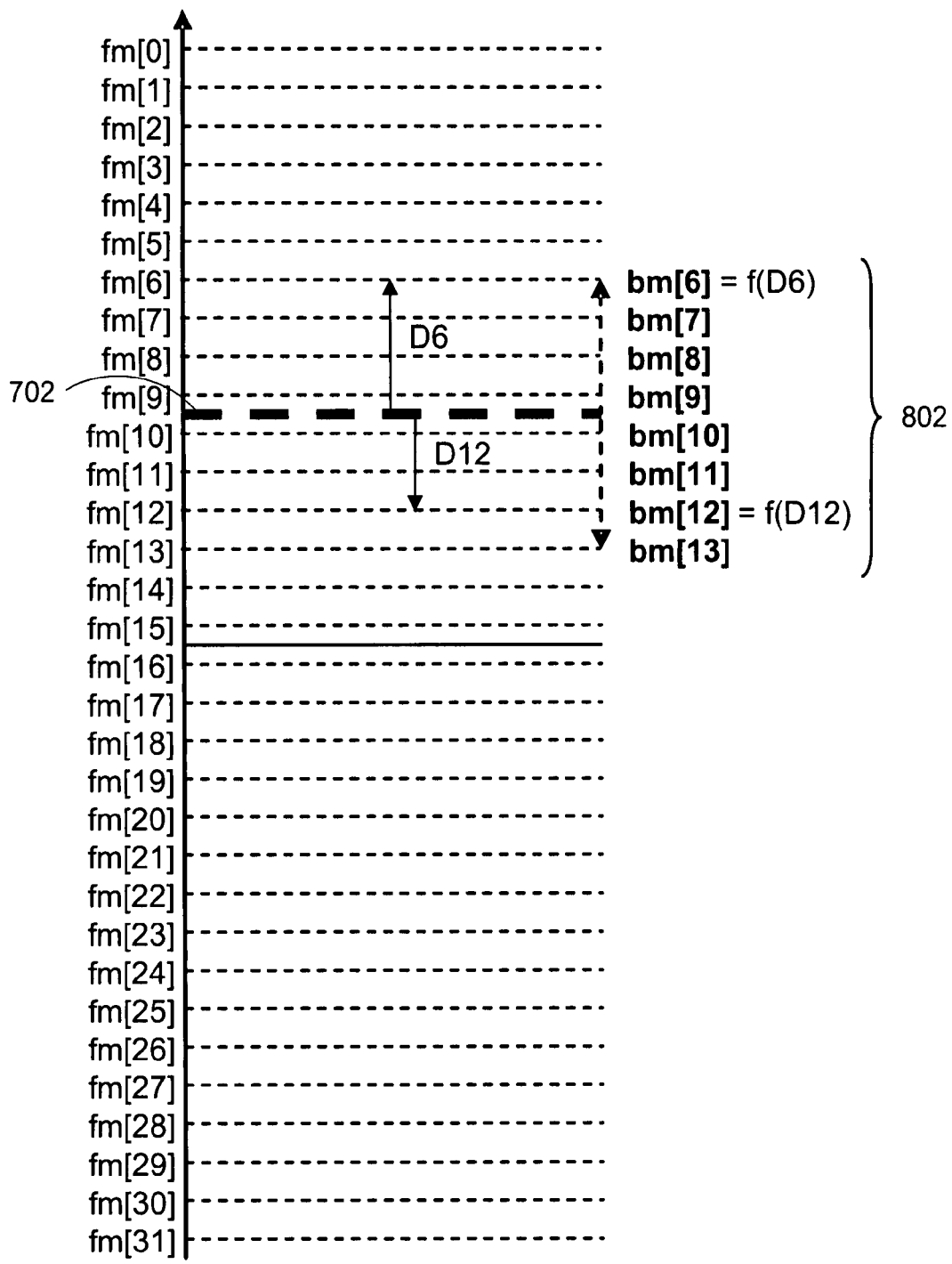
FIG. 8 illustrates selective BM computation based on the trellis branch levels of FIG. 6 and the probable branches of FIG. 7.

FIG. 8 illustrates the operation of one embodiment of a branch metric computation unit (e.g., selective BM computation unit 520 of FIG. 5) using a signal level table similar to the table shown in FIG. 6. Continuing the example of FIG. 7, a detected signal has a voltage level of voltage 702, and bm_sel signal 518 (FIG. 5) indicates that fm[6] through fm[13] correspond to probable branches. Thus, the BM computation unit may compute branch metrics for these eight branches, illustrated by branch metrics 802 in FIG. 8 and designated as bm[6] through bm[13]. Recall that a branch metric represents an error value, where a smaller error value represents a more likely branch. Thus, the eight branch metrics may be functions of the distance between the detected signal and the voltage level of the branch. As illustrated in FIG. 8, bm[6] may be a function of the distance D6 between detected signal 702 and the voltage level of fm[6] (e.g., bm[6]= f(D6)). Similarly, bm[12] may a function of the distance D12 between detected signal 702 and the voltage level of fm[12] (e.g., bm[12]=f(D12)). It may be expected that bm[9] and bm[10] are the branch metrics of smallest magnitude. From there, bm[11] through bm[13] increase in magnitude from the value of bm[10], while bm[8] down to bm[6] increase in magnitude from the value of bm[9].

In some embodiments, a BM computation unit, such as selective BM computation unit 520 of FIG. 5, may compute branch metrics according to $$BM = \frac{(DX)^2}{2\sigma^2} + \frac{1}{2}\log(2\pi\sigma^2),$$

where DX is the distance between detected signal 702 and the voltage level of fm[X], and $\sigma^2$ is the variance of the noise. Thus, for the example of FIG. 8, the BM computation unit may include R=8 components that each implement the above equation. This provides up to a 75% reduction in the number of expensive computation components as compared to a BM computation unit that includes 32 components. In general, an area or complexity reduction of R/S may be realized using some embodiments of the present invention.

Referring back to FIG. 5, selective BM computation unit 520 may produce R branch metrics corresponding to the R probable branches at output 522. For simplicity, the branch metrics for probable branches will, when appropriate, be referred to as probable branch metrics. Using one or more of R probable branch metrics, BM propagation unit 524 may compute branch metrics for the remaining S-R improbable branches. These branch metrics may, where appropriate, be referred to improbable branch metrics. BM propagation unit 524 may compute improbable branch metrics using a technique that uses considerably fewer resources than selective BM computation unit 520. For example, BM propagation unit 524 may compute an improbable branch metric by adding a value to one or more probable branch metrics. This addition computation, whether implemented in hardware, software, or firmware, may be less resource-intensive (in terms of, for example, speed, power, and area) than the equations shown above implemented by selective BM computation unit 520.

In some embodiments, BM propagation unit 524 may set the branch metrics of all the improbable branches to some value greater than the largest probable branch metric. For example, BM propagation unit 524 may set each branch metric for the S-R improbable branches to twice the largest probable branch metric. In these embodiments, the relative likelihood of the improbable branches is not considered in order for BM propagation unit 524 to be implemented especially simply. In other embodiments, to determine improbable branch metrics, BM propagation unit 425 may add values to one or more computed probable branch metric based on the relative likelihood of each improbable branch. These embodiments produce better detection results with greater computation or hardware usage.

Thus, branch metrics for up to all branches in a trellis diagram signal transition may be provided at output 526 of BM propagation unit 524. Some of these branch metrics may be calculated by selective BM computation unit 520 while other branch metrics may be calculated by BM propagation unit 524. The branch metrics that are calculated by selective BM computation unit 520 may be bypassed by BM propagation unit 524 so that they may be unaffected at output 526. In some embodiments, these probable branch metrics may be delayed by a delay block (not shown) for a time substantially equal to the time BM propagation unit 524 takes to calculate improbable branch metrics. Thus, all of the calculated branch metrics may be provided at output 526 at substantially the same time.

Figure 9:
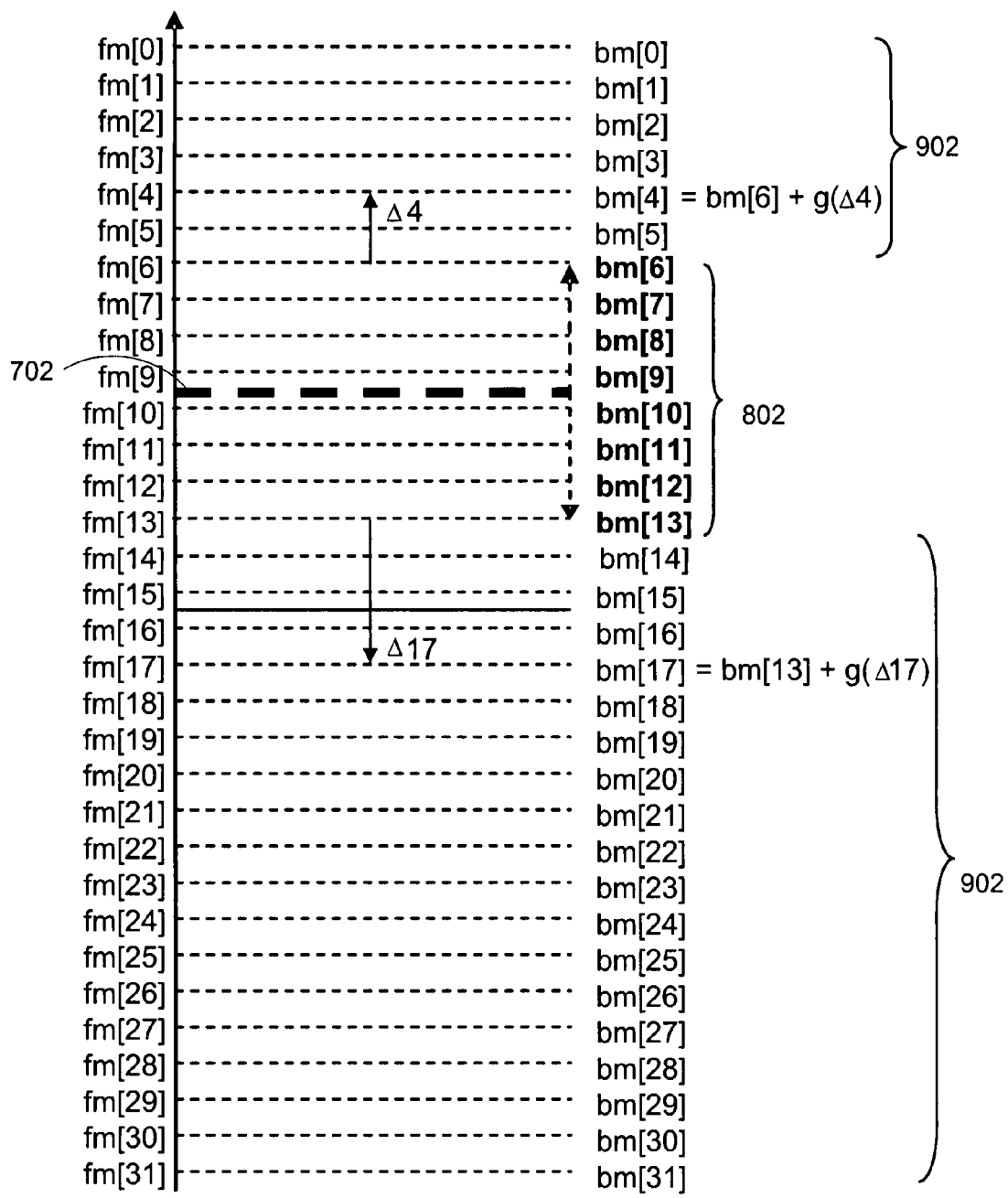
FIG. 9 illustrates branch propagation for improbable branches based on the trellis branch levels of FIG. 6.

Referring now to FIG. 9, improbable branch metrics 902 are shown along with the previously described probable branch metrics 802. In this embodiment, there are clearly more improbable branches than probable branches, allowing for a considerable reduction in hardware or computation complexity. As previously described, in some embodiments, a branch metric propagation unit (e.g., BM propagation unit 524) may determine branch metrics 902 for improbable branches based on their relative likelihood. For example, and as illustrated in FIG. 9, bm[4] may be set to a value that is greater than bm[6], the nearest probable branch, by a value that is a function of its distance, $\Delta 4$, from bm[6]. That is, bm[4] may be given by the equation, bm[4]=bm[6]+g($\Delta 4$). Similarly, bm[17] may be set to a value that is greater than bm[13], the nearest probable branch, by a value that is a function of its distance, L17, from bm[13]. That is, bm[13] may be given by the equation, bm[17]=bm[13]+g($\Delta 17$). The function, g, may be a function that is not computationally expensive. Thus, the function, g, may be considerably less computationally expensive than the function, f, used to compute the probable branches.

Still referring primarily to FIG. 9, in other embodiments of a BM propagation unit (e.g., BM propagation unit 524 of FIG. 5), the BM propagation unit may compute an improbable branch metric, bm[X], based on the number of voltage levels between fm[X] and the voltage level of the closest probable branch. For example, the BM propagation unit may add a predetermined value, B, a certain number of times depending on the voltage level difference. Thus, in FIG. 9, bm[5] may be given by the equation, bm[5]=bm[6]+B, because fm[5] is one voltage level away from voltage fm[6] of a relative branch. Likewise, bm[4] may be given by the equation, bm[4]=bm[6]+2B, because fm[4] is two voltage levels away from fm[6]. In general, therefore, the BM propagation unit could generate improbable branch metrics according to the equation, bm[X]= bm[Y]+|X−Y|B, where X is an improbable branch and Y is the probable branch closest to X. Any other equation may also be contemplated.

In still other embodiments of the present invention, a BM propagation unit (e.g., BM propagation unit 524 of FIG. 5) may determine an improbable branch metric based on the closest branch in the signal level table, regardless of whether that branch is probable or improbable. Thus, the branch metrics of the improbable branches closest to probable branches may first be calculated. The remaining improbable branches could then be calculated iteratively. For example, in FIG. 9, the values of bm[5] and bm[14] could be determined based on probable metrics, bm[6] and bm[13], respectively. After these values are calculated, bm[4] and bm[15] may then be calculated based on bm[5] and bm[14], etc. In some embodiments, using these embodiments may produce similar or the same results as that described above. For example, to compute each new improbable branch metric, a predetermined value, B, may be added to the nearest branch metric. Thus, the BM propagation unit would produce branch metrics according to, bm[X]=bm[Y]+|X−Y|B, where X is an improbable branch and Y is the probable branch closest to X. In some embodiments, using these iterative embodiments, less hardware may be implemented because fewer improbable branch metrics may be calculated in parallel.

Each of the above examples of a BM propagation unit (e.g., BM propagation unit 524 of FIG. 5) has involved computing an improbable branch metric based on adding a value to the branch metric of the closest probable branch, or adding a value to the largest computed branch metric. However, it should be understood that an improbable branch metric may be determined based on one or more of any of the probable branches, and a different, and possibly more complex, operation than adding may be used to compute an improbable branch metric from a probable branch metric. In fact, any implementation of a BM propagation unit that computes improbable branch metrics based on one or more probable branch metrics is within the spirit of the present invention.

As a described above, a BM propagation unit (e.g., BM propagation unit 524 of FIG. 5) may compute improbable branch metrics based on previously computed probable branch metrics rather than based on the equalized signal. This technique may provide considerable complexity and hardware savings. In particular, any additional signal processing on the input signal (e.g., signal-dependent noise-whitening) may be eliminated entirely.

Figure 10:
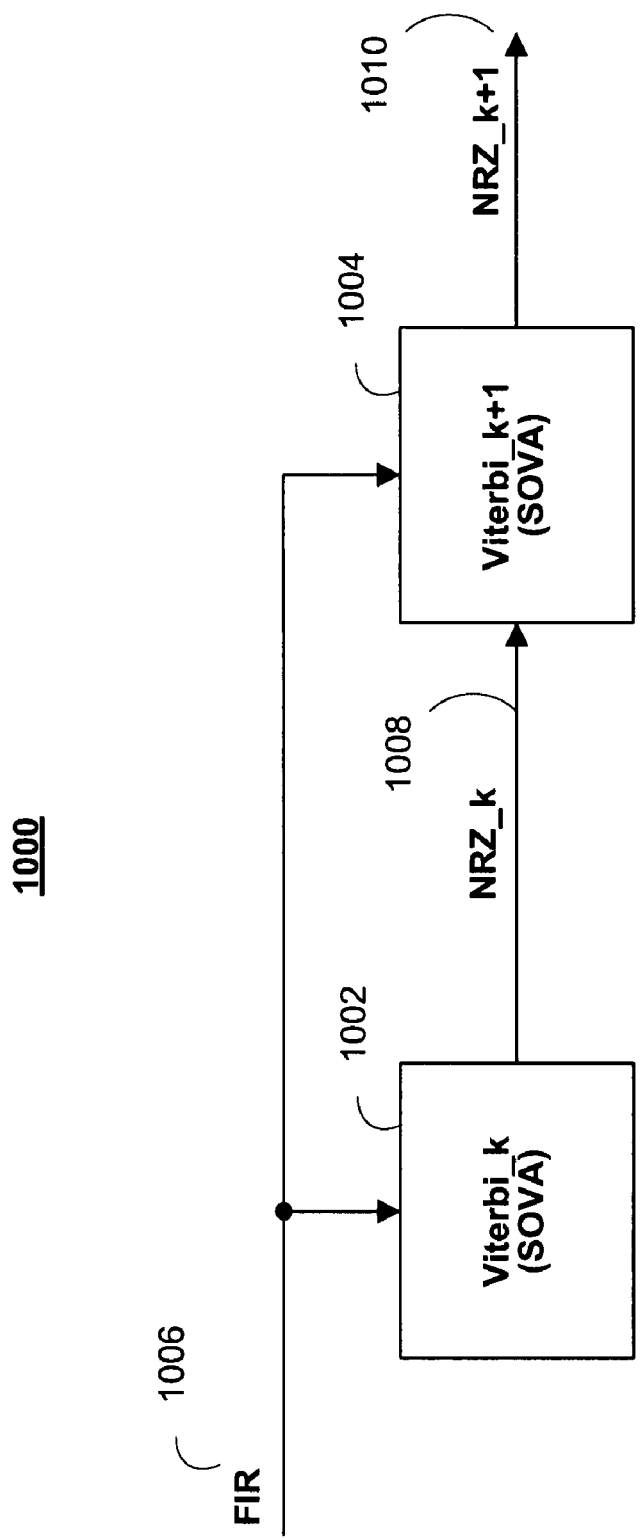
FIG. 10 shows a simplified block diagram of detectors for an iterative decoding system.

The present invention is not limited to situations where only one detector is used. The present invention may also be utilized when multiple detectors are implemented, such as in an iterative decoding scheme. In iterative decoding schemes, multiple soft-output Viterbi detectors and soft decoders can be cascaded such that the (k+1)th Viterbi detector may make decisions based on the soft output of the kth detector/decoder. FIG. 10 shows illustrative detector 1000 for an iterative decoder. First Viterbi detector 1002 may interpret an equalized signal. First Viterbi detector 1002 may return soft information about the signal in the form of an NRZ output 1008. Second Viterbi detector 1004 may then improve the detection performance of the overall detector, namely detector 1000, by performing detection based on both equalized signal 1006 and NRZ signal 1008. Thus, in many circumstances, NRZ output 1010 of second detector 1004 may be more accurate than NRZ output 1008 of first detector 1002.

Although only two Viterbi detectors, detectors 1002 and 1004, are shown in FIG. 10, detector 1000 may include more than two detectors/decoders. The Viterbi detector of the present invention may therefore be utilized in multiple detectors in an iterative decoding system. The number of probable branches determined by a detector and the number of states in a corresponding trellis diagram may differ between different detectors. For example, in some embodiments, the number of probable branches may decrease in later detectors, because their NRZ inputs from previous detectors may be more likely to be correct.

In FIG. 10, Viterbi detector 1002 may be substantially the same as Viterbi detector 1004. In other embodiments, Viterbi detector 1002 may be implemented using more expensive hardware or less expensive hardware than Viterbi detector 1004. For example, in some embodiments of the present invention, Viterbi detector 1002 may be a linear Viterbi detector while detector 1004 may be a non-linear Viterbi detector.

Figure 11:
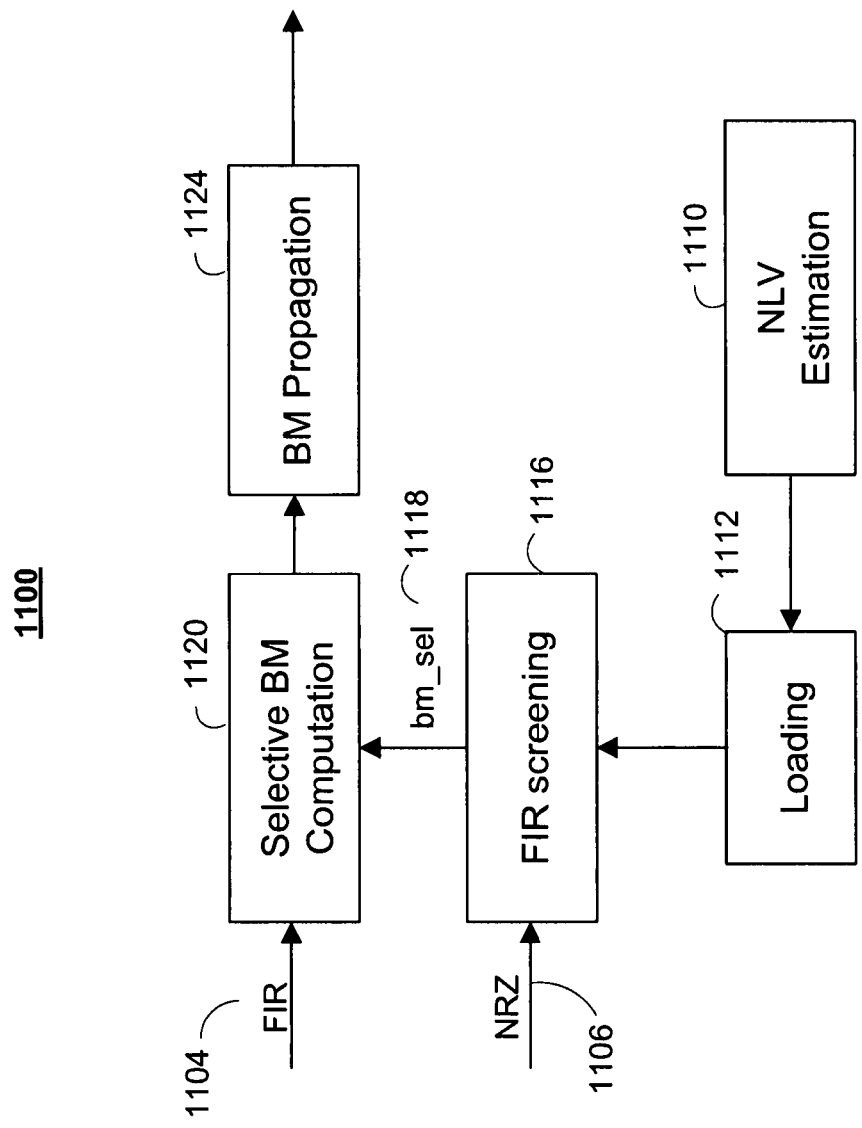
FIG. 11 shows a simplified block diagram of a branch metric computation unit for the iterative decoding system of FIG. 10.

Referring now to FIG. 11, illustrative branch metric (BM) computation unit 1100 is shown that may be included in a detector for an iterative decoding scheme. Some or all of the features of BM computation unit 1100 may be implemented, for example, in detector 1004 of FIG. 10.

Branch metric computation unit 1100 includes NLV estimation unit 1110, loading unit 1112, FIR screening unit 1116, selective BM computation unit 1120, and BM propagation unit 1124. These components may have any of the features and functionalities of their corresponding components (e.g., components of the same name) in branch metric computation unit 500 of FIG. 5. Due to the additional information provided by a previous Viterbi detector (e.g., NRZ output 1008 from linear Viterbi detector 1002), the components of branch metric computation unit 1100 may have other features than those described above in connection with FIG. 5. Because each component of a branch metric computation unit has been thoroughly described above in connection with FIG. 5, the following description will focus primarily on features that are especially probable for cascaded detectors. However, it should be understood that any features described below may be replaced or altered according to the description of branch metric computation unit 500 of FIG. 5.

Branch metric computation unit 1100 of FIG. 11 may utilize an NRZ output from a previous detector (e.g., NRZ output 1008 from Viterbi detector 1002). In particular, rather than selecting probable branches based on the filtered signal, as previously described, FIR screening unit 1116 may select probable branches based on NRZ input signal 1106. Thus, the set of probable branches may be centered around the most likely branch, as previously determined by another detector or decoder.

Figure 12:
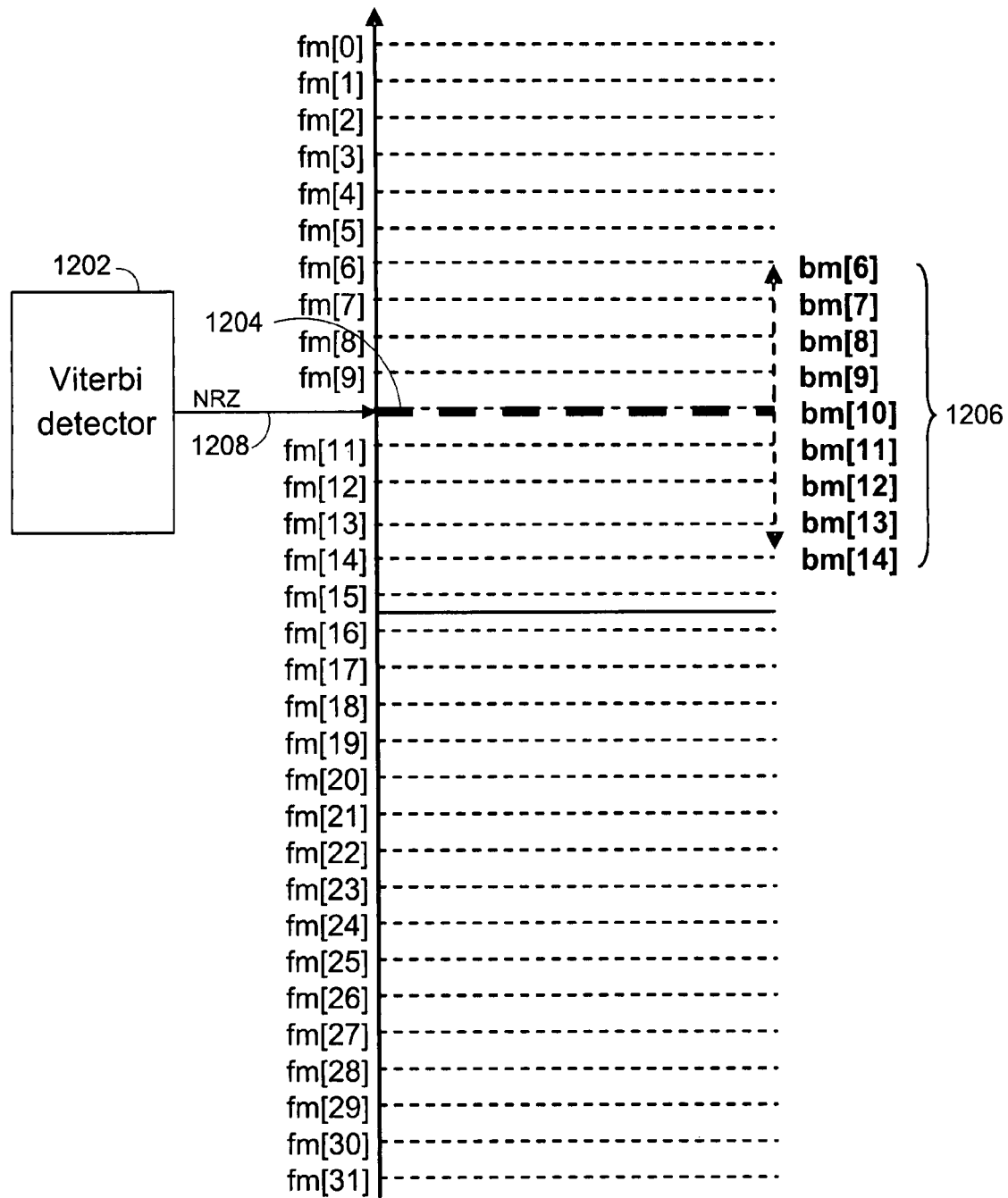
FIG. 12 illustrates branch selection for an iterative decoding scheme based on the trellis branch levels of FIG. 6.

Referring now to FIG. 12, a signal level table such as that of FIG. 7 is again provided to illustrate the operation of a screening unit (e.g., FIR screening unit 1116 of FIG. 11). As shown in FIG. 7, an equalized signal may correspond to voltage 702 between voltage levels fm[9] and fm[10]. Assuming the same FIR signal is obtained, previous Viterbi detector 1202 may determine that the branch corresponding to fm[10] is the actual branch in the trellis representation of the digital information sequence. Thus, previous Viterbi detector 1202 may provide five-bit-resolution NRZ signal 1208, which may be mapped to the voltage level shown by voltage level 1204. Therefore, as expected, NRZ signal 1208 has a voltage level that falls substantially on a branch voltage level, and in this case, fm[10]. Thus, in some embodiments of the present invention, the branches selected by the screening unit may be those closest to the level detected by a previous Viterbi detector. Using decisions from a previous Viterbi detector to determine probable branches may increase detection performance, especially in high noise scenarios, where an equalized signal (not shown) may be considerably different than NRZ signal 1208 obtained from interpreting the equalized signal. Thus, the selection scheme described here may effectively utilize previously computed information.

Although the signal level table of FIG. 12 closely resembles the signal level table of previous figures (e.g., FIGS. 6-9), they may actually be different. Because NRZ input 1208 is derived from a detector, it may have substantially different characteristics than a signal received from elsewhere (e.g., a channel, an equalized signal from a channel, etc.). Therefore, it should be understood that any appropriate signal level table may be used.

In the example of FIG. 12, nine probable branches are selected. In particular, the branches that correspond to fm[6] through fm[14] are chosen. Because NRZ signal level 1204 is substantially on fm[10], both bm[6] and bm[14] are substantially the same distance from bm[10]. Thus, in some embodiments, an odd number of probable branches may be more appropriate. In other embodiments, an even number of probable branches may be chosen by randomly choosing a final branch if two branches are substantially the same distance. In other embodiments of the present invention, a screening unit (e.g., FIR screening unit 1116 of FIG. 11) may select branches based on both an equalized signal (e.g., FIR signal 1104 of FIG. 11) and an output of a previous Viterbi detector (e.g., NRZ signal 1106). For example, probable branches may be chosen based on an average of the equalized signal and the previous Viterbi output signal. In other embodiments, the equalized signal may be used as a "tie-breaker." That is, for the example of FIG. 12, if only eight probable branches are to be selected, the value of the equalized signal may be used to determine whether fm[6] or fm[14] should be considered probable.

Returning to FIG. 11, selective BM computation unit 1120 may use bm_sel signal 1118 from FIR screening unit 1116 to selectively compute branch metrics. For the example of FIG. 12, BM computation unit 1220 may compute bm[6] through bm[14] corresponding to the nine probable branches. Although NRZ signal 1106 is used to determine the probable branches, the branch metric calculations may still be based on the actual equalized input signal, FIR signal 1104. Thus, selective BM computation unit 1220 may have full resolution, and may utilize all of the information in the equalized signal. Using these embodiments, selective BM computation unit 1120 may produce the same branch metric calculation results of selective BM computation unit 520 of BM computation unit 500 (FIG. 5).

Figure 13:
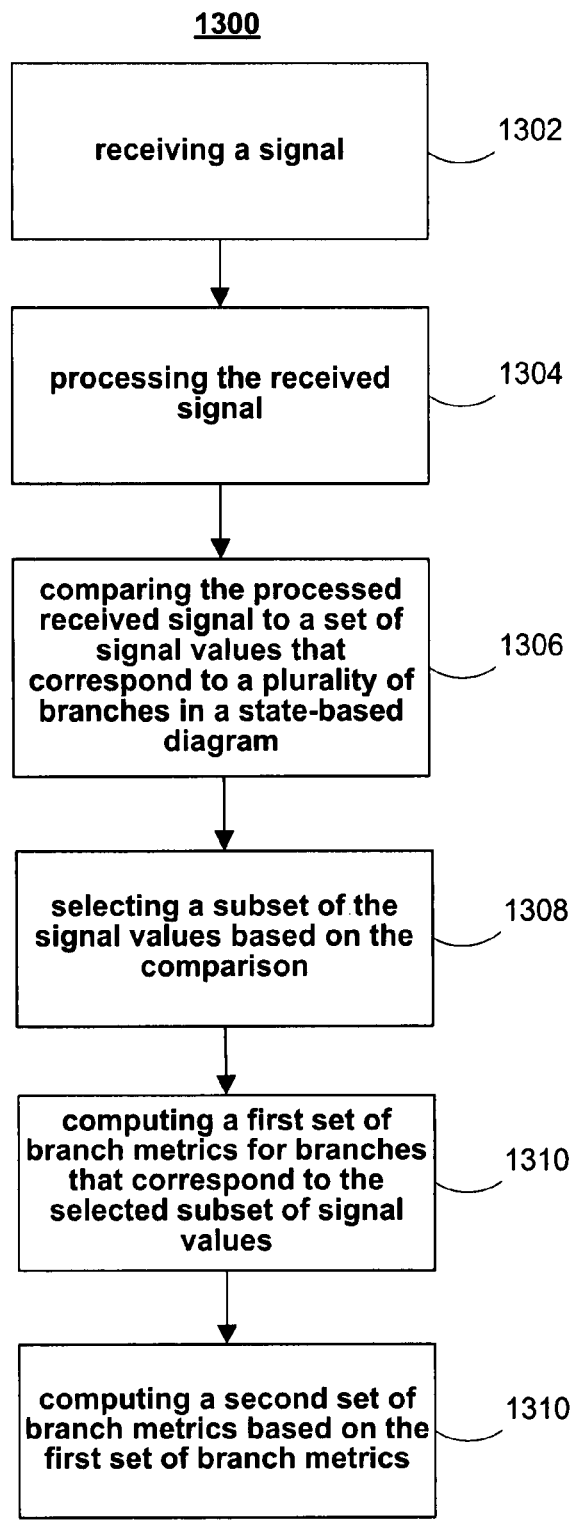
FIG. 13 shows an illustrate flow diagram for computing branch metrics.

Referring now to FIG. 13, illustrative flow diagram 1300 shows steps that a branch metric computation unit (e.g., BM computation unit 500 or BM computation unit 1100 of FIGS. 5 and 11) may use to compute a set of branch metrics. At step 1302, a signal may be received. The signal may have any suitable properties. For example, the signal may be an non-return-to-zero or a return-to-zero signal. The signal may have binary levels (e.g., +a and −a) or the signal may have more levels (e.g., 4, 16, 32 levels, etc.). The signal may be received directly from a channel (e.g., a magnetic recording channel). Alternatively, the signal may be obtained from another component in a Viterbi detector, such as an FIR equalizer or any other suitable filter. In some embodiments, such as when iterative decoding is used, the signal may be received from another detector, which may or may not be a Viterbi detector. In still other embodiments, multiple signals from various sources may be received. For example, a signal from an FIR equalizer may be received and another signal from an output of a Viterbi detector may also be received.

After a signal is received at step 1302, the received signal may be processed at step 1304. In some embodiments, the signal may be equalized or filtered by, for example, an FIR equalizer. The received signal may also be processed by a filter that removes the mean of the signal. In some embodiments, such as when the received signal has already been processed, processing step 1304 may be skipped.

At step 1306, a processed received signal may be compared to a set of signal values. The set of signal values may correspond to branches in a trellis diagram, and each signal value may be an estimated voltage level of a signal that takes that branch. Thus, the processed received signal may be closer in voltage level to some of the signal values than others. The comparison at step 1304 may therefore involve determining the distance between the processed received signal vector and each of the set of signal values.

After the comparison at step 1306, a subset of the signal values may be selected at step 1308. The subset of signal values may be selected based on the comparison at step 1306. In some embodiments, a predetermined number of signal values that are closest to the processed received signal vector may be selected. The predetermined value may be hard-coded or hard-wired, or the predetermined value may be programmable by a user. In other embodiments, a different metric is used that indirectly determines the number of selected signal values. For example, any number of signal values may be selected that are within a predetermined voltage of the processed received signal. This predetermined value may also be hard-coded or hard-wired, or programmed by a user.

At step 1310, a first set of branch metrics may be computed. The first set of branch metrics may correspond to branches that have signal values that were selected at step 1308. The first set of branch metrics may be calculated based on the received signal or the processed received signal. In some embodiments, computing the first set of signal vectors may involve further processing the received signal or the processed received signal. For example, the signal may be processed by a noise-whitening filter to remove signal-dependent or signal-independent noise.

At step 1312, a second set of branch metrics may be computed. The second set of branch metrics may include branch metrics for some or all of the branches that were not selected at step 1308. The second set of branch metrics may be computed based on the first branch metrics. For example, each of the second set of branch metrics may be computed by adding a predetermined value to one or more branch metrics in the first set (e.g., the branch metric of greatest magnitude). In some embodiments, each branch metric in the second set may be set to the same value (e.g., a value larger than all of the branch metrics in the first set). In other embodiments, each branch metric in the second set may depend on the result of the comparison at step 1306.

Referring now to FIGS. 14A-18G, various exemplary implementations of the present invention are shown.

Figure 14A:
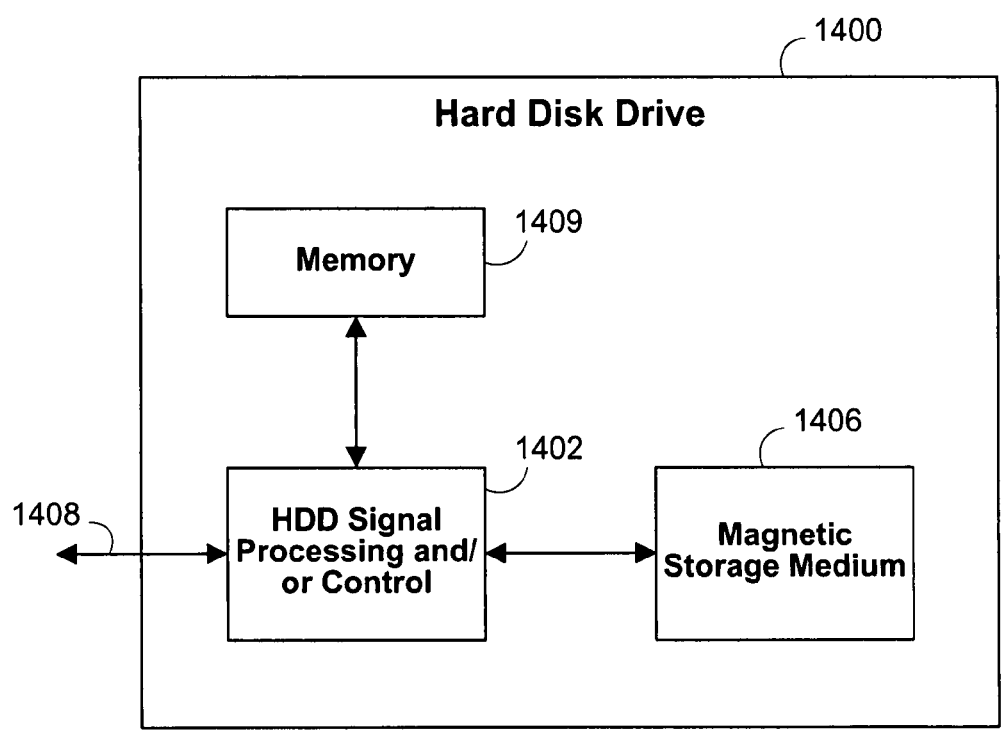
FIG. 14A is a block diagram of an exemplary hard disk drive that can employ the disclosed technology.

Referring now to FIG. 14A, the present invention can be implemented in a hard disk drive 1400. The present invention may implement either or both signal processing and/or control circuits, which are generally identified in FIG. 14A at 1402. In some implementations, the signal processing and/or control circuit 1402 and/or other circuits (not shown) in the HDD 1400 may process data, perform coding and/or encryption, perform calculations, and/or format data that is output to and/or received from a magnetic storage medium 1406.

The HDD 1400 may communicate with a host device (not shown) such as a computer, mobile computing devices such as personal digital assistants, cellular phones, media or MP3 players and the like, and/or other devices via one or more wired or wireless communication links 1408. The HDD 1400 may be connected to memory 1409 such as random access memory (RAM), low latency nonvolatile memory such as flash memory, read only memory (ROM) and/or other suitable electronic data storage.

Figure 14B:
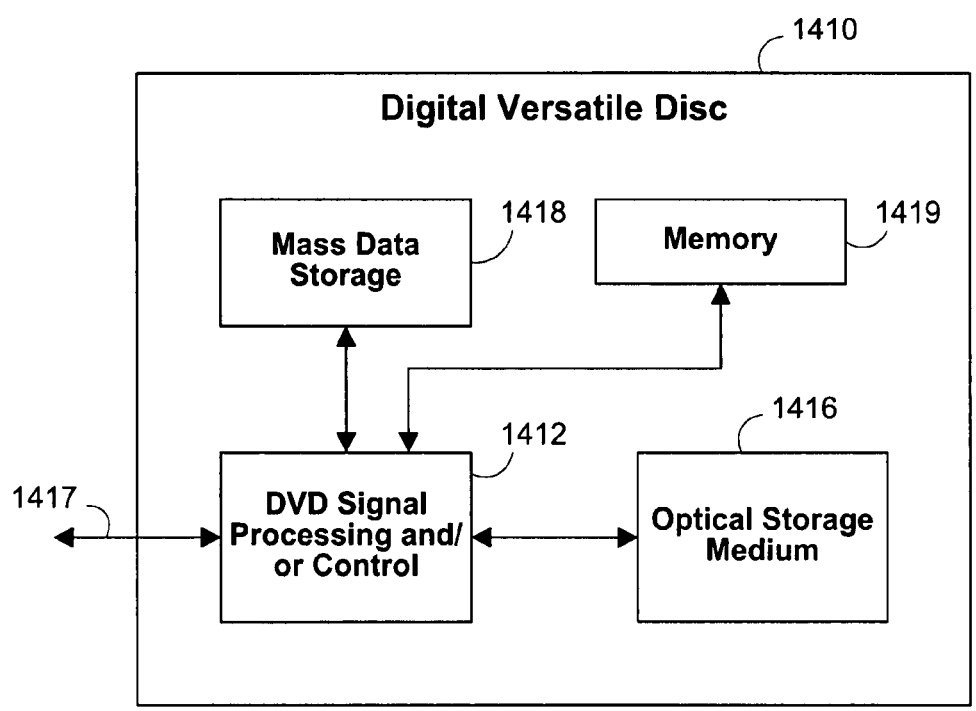
FIG. 14B is a block diagram of an exemplary digital versatile disc that can employ the disclosed technology.

Referring now to FIG. 14B, the present invention can be implemented in a digital versatile disc (DVD) drive 1410. The present invention may implement either or both signal processing and/or control circuits, which are generally identified in FIG. 14B at 1412, and/or mass data storage of the DVD drive 1410. The signal processing and/or control circuit 1412 and/or other circuits (not shown) in the DVD 1410 may process data, perform coding and/or encryption, perform calculations, and/or format data that is read from and/or data written to an optical storage medium 1416. In some implementations, the signal processing and/or control circuit 1412 and/or other circuits (not shown) in the DVD 1410 can also perform other functions such as encoding and/or decoding and/or any other signal processing functions associated with a DVD drive.

The DVD drive 1410 may communicate with an output device (not shown) such as a computer, television or other device via one or more wired or wireless communication links 1417. The DVD 1410 may communicate with mass data storage 1418 that stores data in a nonvolatile manner. The mass data storage 1418 may include a hard disk drive (HDD). The HDD may have the configuration shown in FIG. 14A. The HDD may be a mini HDD that includes one or more platters having a diameter that is smaller than approximately 1.8". The DVD 1410 may be connected to memory 1419 such as RAM, ROM, low latency nonvolatile memory such as flash memory and/or other suitable electronic data storage.

Figure 14C:
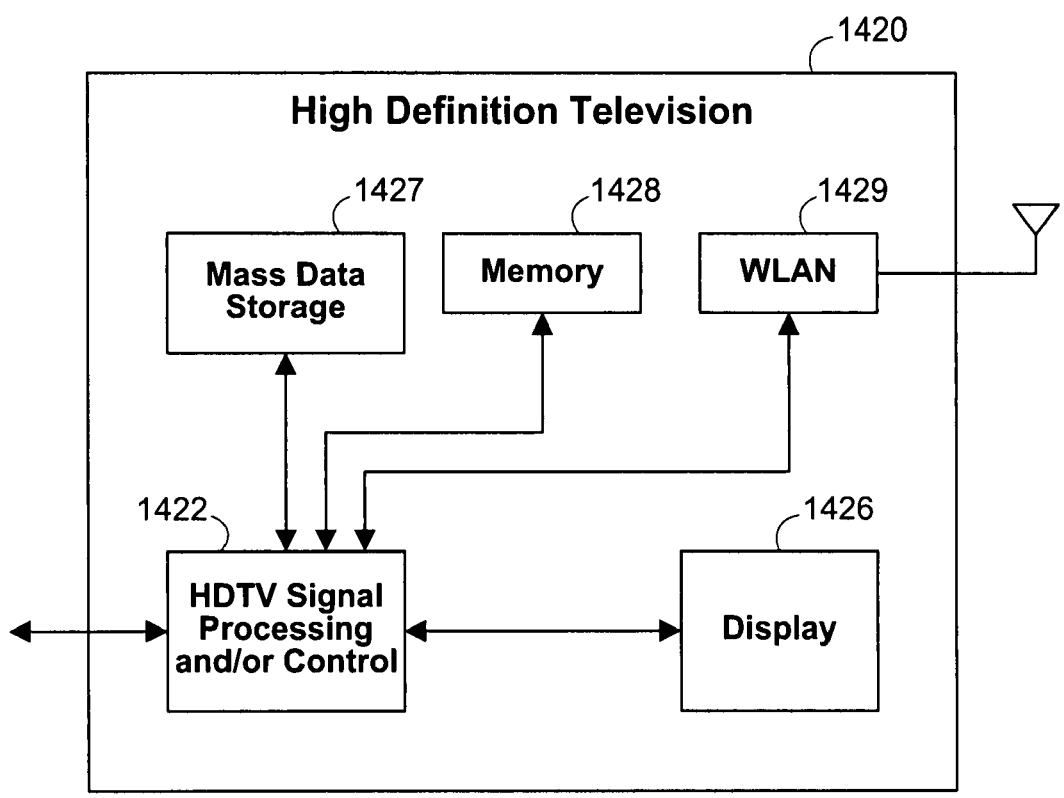
FIG. 14C is a block diagram of an exemplary high definition television that can employ the disclosed technology.

Referring now to FIG. 14C, the present invention can be implemented in a high definition television (HDTV) 1420. The present invention may implement either or both signal processing and/or control circuits, which are generally identified in FIG. 14C at 1422, a WLAN interface and/or mass data storage of the HDTV 1420. The HDTV 1420 receives HDTV input signals in either a wired or wireless format and generates HDTV output signals for a display 1426. In some implementations, signal processing circuit and/or control circuit 1422 and/or other circuits (not shown) of the HDTV 1420 may process data, perform coding and/or encryption, perform calculations, format data and/or perform any other type of HDTV processing that may be required.

The HDTV 1420 may communicate with mass data storage 1427 that stores data in a nonvolatile manner such as optical and/or magnetic storage devices for example hard disk drives HDD and/or DVDs. At least one HDD may have the configuration shown in FIG. 14A and/or at least one DVD may have the configuration shown in FIG. 14B. The HDD may be a mini HDD that includes one or more platters having a diameter that is smaller than approximately 1.8". The HDTV 1420 may be connected to memory 1428 such as RAM, ROM, low latency nonvolatile memory such as flash memory and/or other suitable electronic data storage. The HDTV 1420 also may support connections with a WLAN via a WLAN network interface 1429.

Figure 14D:
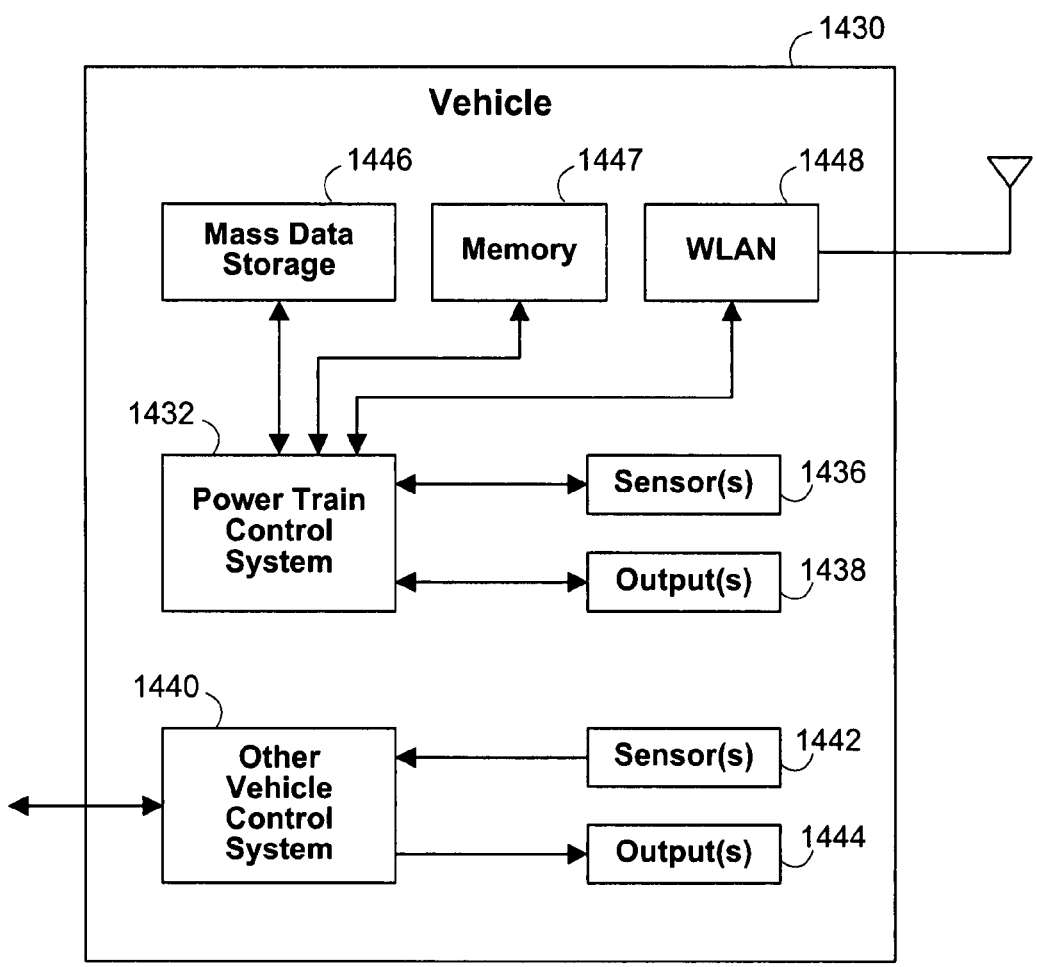
FIG. 14D is a block diagram of an exemplary vehicle that can employ the disclosed technology.

Referring now to FIG. 14D, the present invention implements a control system of a vehicle 1430, a WLAN interface and/or mass data storage of the vehicle control system. In some implementations, the present invention may implement a powertrain control system 1432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1440 of the vehicle 1430. The control system 1440 may likewise receive signals from input sensors 1442 and/or output control signals to one or more output devices 1444. In some implementations, the control system 1440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1432 may communicate with mass data storage 1446 that stores data in a nonvolatile manner. The mass data storage 1046 may include optical and/or magnetic storage devices for example hard disk drives HDD and/or DVDs. At least one HDD may have the configuration shown in FIG. 14A and/or at least one DVD may have the configuration shown in FIG. 14B. The HDD may be a mini HDD that includes one or more platters having a diameter that is smaller than approximately 1.8". The powertrain control system 1432 may be connected to memory 1447 such as RAM, ROM, low latency nonvolatile memory such as flash memory and/or other suitable electronic data storage. The powertrain control system 1432 also may support connections with a WLAN via a WLAN network interface 1448. The control system 1440 may also include mass data storage, memory and/or a WLAN interface (all not shown).

Figure 14E:
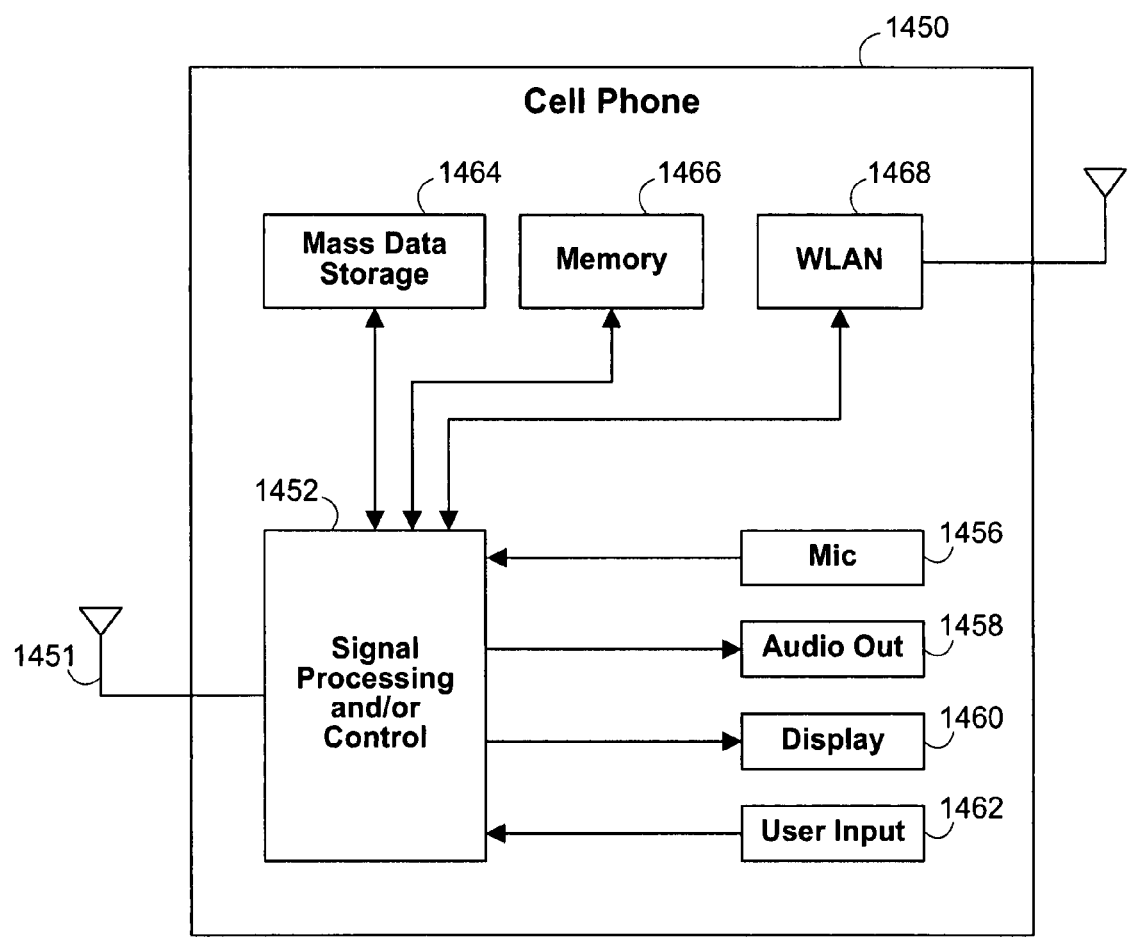
FIG. 14E is a block diagram of an exemplary cell phone that can employ the disclosed technology.

Referring now to FIG. 14E, the present invention can be implemented in a cellular phone 1450 that may include a cellular antenna 1451. The present invention may implement either or both signal processing and/or control circuits, which are generally identified in FIG. 14E at 1452, a WLAN interface and/or mass data storage of the cellular phone 1450. In some implementations, the cellular phone 1450 includes a microphone 1456, an audio output 1458 such as a speaker and/or audio output jack, a display 1460 and/or an input device 1462 such as a keypad, pointing device, voice actuation and/or other input device. The signal processing and/or control circuits 1452 and/or other circuits (not shown) in the cellular phone 1450 may process data, perform coding and/or encryption, perform calculations, format data and/or perform other cellular phone functions.

The cellular phone 1450 may communicate with mass data storage 1464 that stores data in a nonvolatile manner such as optical and/or magnetic storage devices for example hard disk drives HDD and/or DVDs. At least one HDD may have the configuration shown in FIG. 14A and/or at least one DVD may have the configuration shown in FIG. 14B. The HDD may be a mini HDD that includes one or more platters having a diameter that is smaller than approximately 1.8". The cellular phone 1450 may be connected to memory 1466 such as RAM, ROM, low latency nonvolatile memory such as flash memory and/or other suitable electronic data storage. The cellular phone 1450 also may support connections with a WLAN via a WLAN network interface 1468.

Figure 14F:
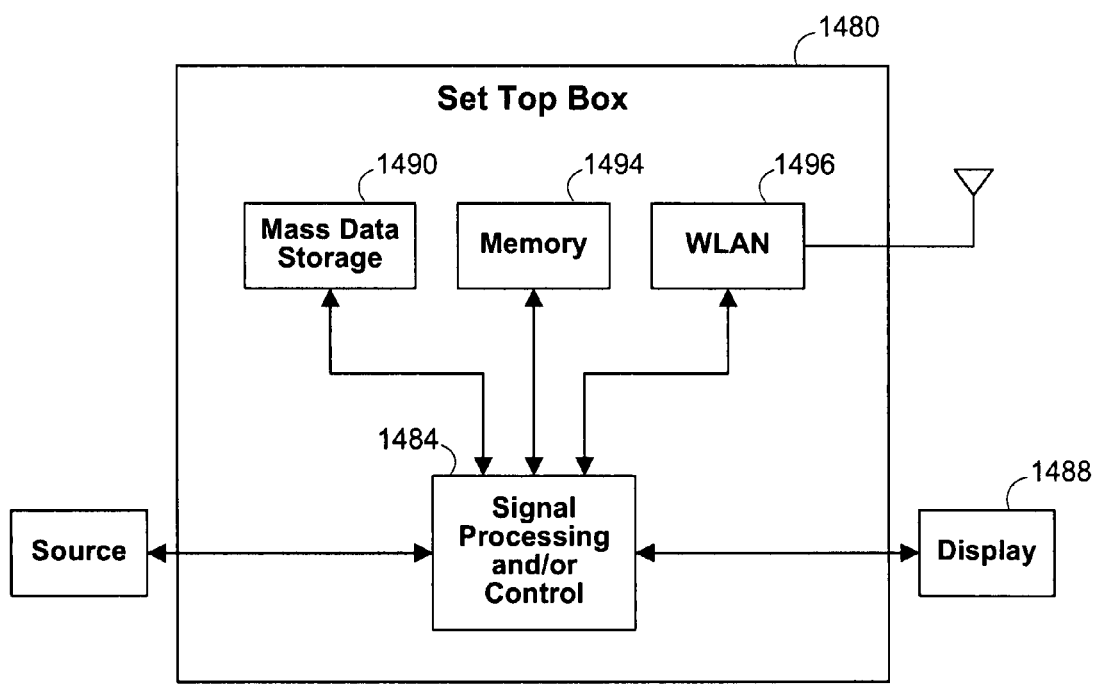
FIG. 14F is a block diagram of an exemplary set top box that can employ the disclosed technology.

Referring now to FIG. 14F, the present invention can be implemented in a set top box 1480. The present invention may implement either or both signal processing and/or control circuits, which are generally identified in FIG. 14F at 1484, a WLAN interface and/or mass data storage of the set top box 1480. The set top box 1480 receives signals from a source such as a broadband source and outputs standard and/or high definition audio/video signals suitable for a display 1488 such as a television and/or monitor and/or other video and/or audio output devices. The signal processing and/or control circuits 1484 and/or other circuits (not shown) of the set top box 1480 may process data, perform coding and/or encryption, perform calculations, format data and/or perform any other set top box function.

The set top box 1480 may communicate with mass data storage 1490 that stores data in a nonvolatile manner. The mass data storage 1490 may include optical and/or magnetic storage devices for example hard disk drives HDD and/or DVDs. At least one HDD may have the configuration shown in FIG. 14A and/or at least one DVD may have the configuration shown in FIG. 14B. The HDD may be a mini HDD that includes one or more platters having a diameter that is smaller than approximately 1.8". The set top box 1480 may be connected to memory 1494 such as RAM, ROM, low latency nonvolatile memory such as flash memory and/or other suitable electronic data storage. The set top box 1480 also may support connections with a WLAN via a WLAN network interface 1496.

Figure 14G:
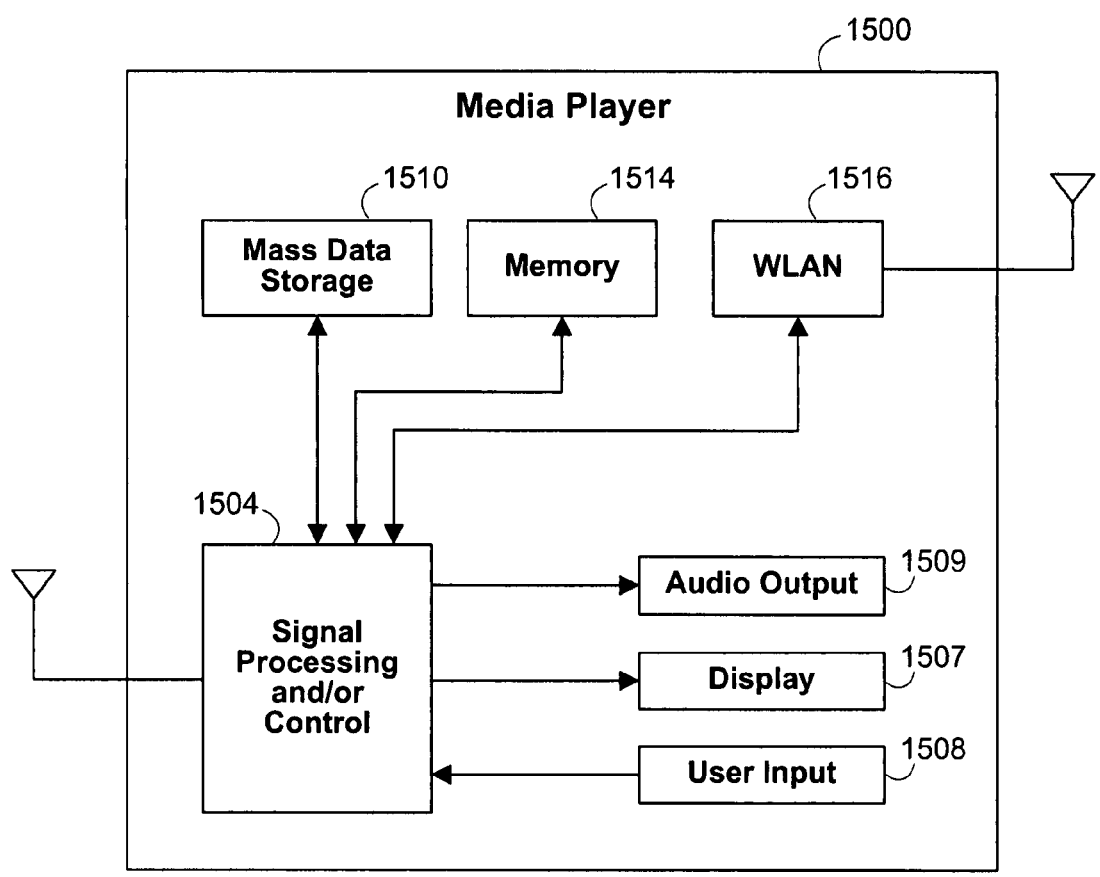
FIG. 14G is a block diagram of an exemplary media player that can employ the disclosed technology.

Referring now to FIG. 14G, the present invention can be implemented in a media player 1560. The present invention may implement either or both signal processing and/or control circuits, which are generally identified in FIG. 14G at 1504, a WLAN interface and/or mass data storage of the media player 1500. In some implementations, the media player 1500 includes a display 1507 and/or a user input 1508 such as a keypad, touchpad and the like. In some implementations, the media player 1500 may employ a graphical user interface (GUI) that typically employs menus, drop down menus, icons and/or a point-and-click interface via the display 1507 and/or user input 1508. The media player 1500 further includes an audio output 1509 such as a speaker and/or audio output jack. The signal processing and/or control circuits 1504 and/or other circuits (not shown) of the media player 1500 may process data, perform coding and/or encryption, perform calculations, format data and/or perform any other media player function.

The media player 1500 may communicate with mass data storage 1510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 14A and/or at least one DVD may have the configuration shown in FIG. 14B. The HDD may be a mini HDD that includes one or more platters having a diameter that is smaller than approximately 1.8". The media player 1500 may be connected to memory 1514 such as RAM, ROM, low latency nonvolatile memory such as flash memory and/or other suitable electronic data storage. The media player 1500 also may support connections with a WLAN via a WLAN network interface 1516. Still other implementations in addition to those described above are contemplated.

The foregoing describes systems and methods for reducing the complexity of a non-linear Viterbi detector. Those skilled in the art will appreciate that the invention can be practiced by other than the described embodiments, which are presented for the purpose of illustration rather than of limitation.

What is claimed is:

1. A method of computing a plurality of branch metrics for use in identifying information in a signal, comprising:
   selecting a first set of branches associated with signal values closest to the signal;
   computing a first set of branch metrics for the first set of branches using a first process; and computing a second set of branch metrics for a second set of branches using a second process, wherein the first set of branches and the second set of branches are distinct, and wherein the second process is implemented using fewer resources for each branch metric calculation than the first process.

2. The method of claim 1 wherein the resources comprise one or more of silicon area of a device, processing speed, and power consumption.

3. The method of claim 1 wherein the first set of branches and the second set of branches correspond to state transitions in a trellis diagram.

4. The method of claim 1 wherein each branch in the first and second set of branches corresponds to a possible value of the information, and wherein the branch metric associated with each branch indicates a likelihood of the possible value corresponding to that branch.

5. The method of claim 1 wherein the second set of branch metrics is computed based on results of computing the first set of branch metrics.

6. The method of claim 5 wherein the second process comprises adding a predetermined value to a branch metric in the first set.

7. The method of claim 1 wherein the first process comprises:
identifying a signal value associated with a branch in the first set;
computing a voltage difference between the signal value and a voltage of the signal; and
computing a branch metric based on the voltage difference.

8. The method of claim 1, wherein the first set of branch metrics and the second set of branch metrics are computed by a detector.

9. A method of computing a plurality of branch metrics for use in identifying information in a signal, comprising:
receiving the signal;
comparing the received signal to a set of signal values that correspond to a plurality of branches in a state-based diagram;
selecting a subset of the signal values based on the comparison, wherein selecting a subset of the signal values comprises choosing the signal values closest to the received signal;
computing a first set of branch metrics for branches that correspond to the selected subset of the signal values; and
computing a second set of branch metrics based on the first set of branch metrics.

10. The method of claim 9 wherein the state-based diagram is a trellis diagram.

11. The method of claim 10 wherein the trellis diagram is a 16-state trellis diagram having up to 32 branches between two time intervals.

12. The method of claim 9 wherein the signal values correspond to voltage levels.

13. The method of claim 12 wherein computing the first set of branch metrics comprises, for each branch of the selected subset, computing a branch metric based on a voltage difference between the received signal and a signal value corresponding to that branch.

14. The method of claim 9, further comprising:
equalizing the received signal;
filtering a mean from the equalized signal; and
comparing the mean-filtered equalized signal with the set of signal values.

15. The method of claim 9, further comprising ordering the set of signal values based on magnitude.

16. The method of claim 9 wherein computing the second set of branch metrics comprises setting each branch metric to a value greater than a greatest branch metric in the first set of branch metrics.

17. The method of claim 9 wherein computing one of the second set of branch metrics comprises adding a predetermined value to a branch metric from the first set of branch metrics.

18. The method of claim 17, further comprising selecting the branch metric from the first set of branch metrics with an associated signal value closest to an input signal value.

19. The method of claim 17, further comprising selecting the branch metric from the first set of branch metrics with greatest magnitude.

20. The method of claim 9 wherein computing one of the second set of branch metrics comprises adding a predetermined value to a branch metric corresponding to a neighboring signal value.

21. The method of claim 9, further comprising receiving a second signal, wherein the subset of the signal values is selected based on the second signal.

22. An apparatus for computing a plurality of branch metrics for use in identifying information in a signal, comprising:
means for selecting a first set of branches associated with signal values closest to the signal;
means for computing a first set of branch metrics for the first set of branches using a first process; and
means for computing a second set of branch metrics for a second set of branches using a second process, wherein the first set of branches and the second set of branches are distinct, and wherein the means for computing the second set of branch metrics uses fewer resources for each branch metric computation than the means for computing the first set.

23. The apparatus of claim 22 wherein the resources comprise one or more of silicon area of a device, processing speed, and power consumption.

24. The apparatus of claim 22 wherein the first set of branches and the second set of branches correspond to state transitions in a trellis diagram.

25. The apparatus of claim 22, wherein:
the branch metrics in the first and second sets are used to identify information in a signal;
each branch in the first and second set of branches corresponds to a possible value of the information; and
the branch metric associated with each branch indicates a likelihood of the possible value corresponding to that branch.

26. The apparatus of claim 22 wherein the means for computing the second set of branch metrics computes branch metrics based on the first set of branch metrics.

27. The apparatus of claim 26, wherein the means for computing the second set of branches using the second process comprises means for adding a predetermined value to a branch metric in the first set.

28. The apparatus of claim 22 wherein the means for computing the first set of branches using the first process comprises:
means for identifying a signal value associated with a branch in the first set;
means for computing a voltage difference between the signal value and a voltage of the received signal; and
means for computing a branch metric based on the voltage difference.

29. An apparatus for computing a plurality of branch metrics for use by a detector, comprising:

means for receiving a signal;

means for comparing the received signal to a set of signal values that correspond to a plurality of branches in a state-based diagram;

means for selecting a subset of the signal values based on the comparison, wherein the means for selecting a subset of the signal values comprises means for choosing the signal values closest to the received signal;

means for computing a first set of branch metrics for branches that correspond to the selected subset of the signal values; and means for computing a second set of branch metrics based on the first set of branch metrics.

30. The apparatus of claim 29 wherein the state-based diagram is a trellis diagram.

31. The apparatus of claim 30 wherein the trellis diagram is a 16-state trellis diagram having up to 32 branches between two time intervals.

32. The apparatus of claim 29 wherein the signal values correspond to voltage levels.

33. The apparatus of claim 32 wherein means for computing the first set of branch metrics comprises, for each branch of the selected subset, means for computing a branch metric based on a voltage difference between the received signal and a signal value corresponding to that branch.

34. The apparatus of claim 29, further comprising:
means for equalizing the received signal;
means for filtering a mean from the equalized signal; and
means for comparing the mean-filtered equalized signal with the set of signal values.

35. The apparatus of claim 29, further comprising means for ordering the set of signal values based on magnitude.

36. The apparatus of claim 29 wherein the means for computing the second set of branch metrics comprises means for setting each branch metric to a value greater than a greatest branch metric in the first set of branch metrics.

37. The apparatus of claim 29 wherein the means for computing one of the second set of branch metrics comprises means for adding a predetermined value to a branch metric from the first set of branch metrics.

38. The apparatus of claim 37, further comprising means for selecting the branch metric from the first set of branch metrics with an associated signal value closest to an input signal value.

39. The apparatus of claim 37, further comprising means for selecting the branch metric from the first set of branch metrics with greatest magnitude.

40. The apparatus of claim 29 wherein the means for computing one of the second set of branch metrics comprises means for adding a predetermined value to a branch metric corresponding to a neighboring signal value.

41. The apparatus of claim 29, further comprising means for receiving a second signal, wherein the subset of the signal values is selected based on the second signal.

42. A system for computing a plurality of branch metrics for use in identifying information in a signal, comprising:
a first computation unit that selects a first set of branches associated with signal values closest to the signal and computes a first set of branch metrics for the first set of branches; and
a second computation unit that computes a second set of branch metrics for a second set of branches, wherein the first set of branches and the second set of branches are distinct, and wherein the second computation unit uses fewer resources than the first computation unit.

43. The system of claim 42 wherein the resource comprises one or more of silicon area, processing speed, and power consumption.

44. The system of claim 42 wherein the first set of branches and the second set of branches correspond to state transitions in a trellis diagram.

45. The system of claim 42 wherein:
the branch metrics in the first and second sets are used to identify information in a signal;
each branch in the first and second set of branches corresponds to a possible value of the information; and
the branch metric associated with each branch indicates a likelihood of the possible value corresponding to that branch.

46. The system of claim 42 wherein the second set of branch metrics is computed based on the computed first set of branch metrics.

47. The system of claim 46, wherein the second computation unit adds a predetermined value to a branch metric in the first set to compute a branch metric for the second set.

48. The system of claim 42 wherein the first computation unit:
identifies a signal value associated with a branch in the first set;
computes a voltage difference between the signal value and a voltage of the signal; and
computes a branch metric based on the voltage difference.

49. A detector having the system defined in claim 42.

50. A system for computing a plurality of branch metrics for use by a detector, comprising:
a receiver for receiving a signal;
a comparator for comparing the received signal to a set of signal values that correspond to a plurality of branches in a state-based diagram;
a screening unit for selecting a subset of the signal values based on the comparison, wherein the screening unit chooses the signal values closest to the received signal;
a selective branch metric computation unit for computing a first set of branch metrics for branches that correspond to the selected subset of the signal values; and
a branch metric propagation unit for computing a second set of branch metrics based on the first set of branch metrics.

51. The system of claim 50 wherein the state-based diagram is a trellis diagram.

52. The system of claim 51 wherein the trellis diagram is a 16-state trellis diagram having up to 32 branches between two time intervals.

53. The system of claim 50 wherein the signal values correspond to voltage levels.

54. The system of claim 53 wherein the selective branch metric computation unit computes, for each branch of the selected subset, a branch metric based on a voltage difference between the received signal and a signal value corresponding to that branch.

55. The system of claim 50, further comprising:
an equalizer for equalizing the received signal;
a filter for filtering a mean from the equalized signal; and
comparison circuitry for comparing the mean-filtered equalized signal with the set of signal values.

56. The system of claim 50, further comprising circuitry for ordering the set of signal values based on magnitude.

57. The system of claim 50 wherein the branch metric propagation unit sets each branch metric to a value greater than a greatest branch metric in the first set of branch metrics.

58. The system of claim 50 wherein the branch metric propagation unit adds a predetermined value to a branch metric from the first set of branch metrics.

59. The system of claim 58, further comprising metric selection circuitry for selecting the branch metric from the first set of branch metrics with an associated signal value closest to an input signal value.

60. The system of claim 58, further comprising metric selection circuitry for selecting the branch metric from the first set of branch metrics with greatest magnitude.

61. The system of claim 50 wherein the branch metric propagation unit comprises an adder for adding a predetermined value to a branch metric corresponding to a neighboring signal value.

62. A Viterbi detector having the system of claim 50, the Viterbi detector further comprising:
 an ACS unit for selecting paths in the state-based diagram; and
 a trace back unit for recalling a best path through the state-based diagram.

63. The system of claim 62 wherein the trace back unit is a soft-output Viterbi algorithm unit.

64. An iterative decoder having a plurality of detectors, wherein at least one detector includes the system defined in claim 50.

65. The system of claim 64, wherein the screening unit of the at least one detector selects the signal values based on an output of another of the plurality of detectors.

* * * * *